(12) United States Patent
Hazzard

(10) Patent No.: US 8,917,513 B1
(45) Date of Patent: Dec. 23, 2014

(54) DATA CENTER EQUIPMENT CABINET INFORMATION CENTER AND UPDATEABLE ASSET TRACKING SYSTEM

(71) Applicant: Methode Electronics, Inc., Chicago, IL (US)

(72) Inventor: Tim Hazzard, Allen, TX (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 14/208,164

(22) Filed: Mar. 13, 2014

Related U.S. Application Data

(63) Continuation-in-part of application No. 14/168,753, filed on Jan. 30, 2014, now Pat. No. 8,854,822, which is a continuation of application No. 13/954,473, filed on Jul. 30, 2013.

(60) Provisional application No. 61/677,299, filed on Jul. 30, 2012, provisional application No. 61/694,984, filed on Aug. 30, 2012.

(51) Int. Cl.
| | |
|---|---|
| *H05K 5/00* | (2006.01) |
| *G06Q 10/08* | (2012.01) |
| *G06F 1/18* | (2006.01) |
| *H05K 7/16* | (2006.01) |
| *H02B 1/20* | (2006.01) |
| *A47F 5/08* | (2006.01) |
| *A47B 81/00* | (2006.01) |
| *A47B 97/00* | (2006.01) |

(52) U.S. Cl.
CPC .............. *G06Q 10/087* (2013.01); *G06F 1/182* (2013.01)
USPC ........... 361/724; 361/726; 361/727; 361/826; 211/153; 312/223.2

(58) Field of Classification Search
USPC ......... 361/724, 725, 726, 727, 826, 827, 828, 361/601, 622; 174/17.05, 72 C; 211/153; 312/223.1, 223.2; 340/12.51, 13.26
See application file for complete search history.

(56) References Cited

U.S. PATENT DOCUMENTS

| | | |
|---|---|---|
| 4,316,256 A | 2/1982 | Hendricks et al. |
| 4,730,941 A | 3/1988 | Levine et al. |

(Continued)

OTHER PUBLICATIONS

White Rodgers, Installation and Operating Instructions Manual, Model 1F95-1291.

(Continued)

*Primary Examiner* — Hoa C Nguyen
*Assistant Examiner* — Binh Tran
(74) *Attorney, Agent, or Firm* — Loeb & Loeb LLP

(57) ABSTRACT

A cabinet frame enclosure is provided having a first side wall, a second side wall, a first opening and a second opening each in combination defining an interior space for accommodating a plurality of equipment, the equipment being removable through the first opening. A plurality of functional modules are provided such as: an asset tracking module for detecting the presence or absence of the equipment from the interior space of the cabinet frame enclosure, the asset tracking module disposed in the first side wall adjacent the first opening; an access control module for providing electronic locking and access control to the interior space of the cabinet frame enclosure; an environmental management module for monitoring and controlling environmental conditions within the interior space of the cabinet frame enclosure; a power management module for monitoring and controlling power distribution to equipment located in the interior space of the cabinet frame enclosure, the power management module disposed in one of the first side wall or second side wall and adjacent the second opening; and a cabinet control module (CCM) for providing consolidated connectivity to the plurality of functional modules, wherein the CCM presents a single network connection for managing the equipment located in the cabinet frame enclosure.

21 Claims, 19 Drawing Sheets

(56) References Cited

U.S. PATENT DOCUMENTS

| | | |
|---|---|---|
| 4,733,719 A | 3/1988 | Levine |
| 4,967,382 A | 10/1990 | Hall |
| 5,038,851 A | 8/1991 | Mehta |
| 5,230,482 A | 7/1993 | Ratz et al. |
| 5,482,209 A | 1/1996 | Cochran et al. |
| 5,765,636 A | 6/1998 | Meyer et al. |
| 5,782,296 A | 7/1998 | Mehta |
| 5,937,942 A | 8/1999 | Bias et al. |
| 6,116,512 A | 9/2000 | Dushane et al. |
| 6,196,467 B1 | 3/2001 | Dushane et al. |
| 6,213,404 B1 | 4/2001 | Dushane et al. |
| 6,435,418 B1 | 8/2002 | Toth et al. |
| 6,478,233 B1 | 11/2002 | Shah |
| 6,502,758 B2 | 1/2003 | Cotrell |
| 6,549,870 B2 | 4/2003 | Proffitt et al. |
| 6,595,430 B1 | 7/2003 | Shah |
| 6,621,507 B1 | 9/2003 | Shah |
| 6,628,997 B1 | 9/2003 | Fox et al. |
| 6,783,079 B2 | 8/2004 | Carey et al. |
| 6,814,299 B1 | 11/2004 | Carey |
| 6,824,069 B2 | 11/2004 | Rosen |
| 6,892,547 B2 | 5/2005 | Strand |
| 7,028,912 B1 | 4/2006 | Rosen |
| 7,050,026 B1 | 5/2006 | Rosen |
| 7,114,554 B2 | 10/2006 | Bergman et al. |
| 7,142,948 B2 | 11/2006 | Metz |
| 7,146,253 B2 | 12/2006 | Hoog et al. |
| 7,156,318 B1 | 1/2007 | Rosen |
| 7,181,317 B2 | 2/2007 | Amundson et al. |
| 7,225,054 B2 | 5/2007 | Amundson et al. |
| 7,274,972 B2 | 9/2007 | Amundson et al. |
| 7,287,709 B2 | 10/2007 | Proffitt et al. |
| 7,302,642 B2 | 11/2007 | Smith et al. |
| 7,320,110 B2 | 1/2008 | Shah |
| 7,360,717 B2 | 4/2008 | Shah |
| 7,454,269 B1 | 11/2008 | Dushane et al. |
| 7,513,438 B2 | 4/2009 | Mueller |
| 7,556,207 B2 | 7/2009 | Mueller |
| 7,584,897 B2 | 9/2009 | Schultz et al. |
| 7,604,046 B2 | 10/2009 | Bergman et al. |
| 7,636,604 B2 | 12/2009 | Bergman et al. |
| 7,693,582 B2 | 4/2010 | Bergman et al. |
| 7,693,583 B2 | 4/2010 | Wolff et al. |
| 7,703,694 B2 | 4/2010 | Mueller et al. |
| 7,706,923 B2 | 4/2010 | Amundson et al. |
| 7,719,835 B1 | 5/2010 | Schluter |
| 7,748,225 B2 | 7/2010 | Butler et al. |
| 7,775,454 B2 | 8/2010 | Mueller et al. |
| 7,784,291 B2 | 8/2010 | Butler et al. |
| 8,570,169 B2 * | 10/2013 | Green et al. .................. 340/540 |
| 2007/0228182 A1 | 10/2007 | Wagner et al. |
| 2007/0278320 A1 | 12/2007 | Lunacek et al. |
| 2010/0106626 A1 * | 4/2010 | Ashrafzadeh et al. .......... 705/29 |
| 2012/0044054 A1 * | 2/2012 | Hussain et al. .............. 340/10.1 |
| 2012/0113592 A1 | 5/2012 | Chen |

OTHER PUBLICATIONS

Pro1 1AQ Operating Manual True Comfort IIII, Model T955, 2010.

Honeywell, Operating Manual VisionPro TH800, 2009.

* cited by examiner

FIG.17

INPUT LINES

| 1 | 0.0A |
|---|------|
| 2 | 2.2A |

OUTLET PORTS

| 1 | 2.0A | 11 | 0.0A |
|---|------|----|------|
| 2 | 0.0A | 12 | 0.0A |
| 3 | 0.0A | 13 | 0.0A |
| 4 | 0.0A | 14 | 0.0A |
| 5 | 0.0A | 15 | 0.0A |
| 6 | 0.0A | 16 | 0.1A |
| 7 | 0.0A | 17 | 0.0A |
| 8 | 0.0A | 18 | 0.0A |
| 9 | 0.0A | 19 | 0.0A |
| 10 | 0.0A | 20 | 0.1A |

| 1 | 0.0A | 11 | 0.0A |
|---|------|----|------|
| 2 | 0.0A | 12 | 0.0A |
| 3 | 0.0A | 13 | 0.0A |
| 4 | 0.0A | 14 | 0.0A |
| 5 | 0.0A | 15 | 0.0A |
| 6 | 0.0A | 16 | 0.0A |
| 7 | 0.0A | 17 | 0.0A |
| 8 | 0.0A | 18 | 0.0A |
| 9 | 0.0A | 19 | 0.0A |
| 10 | 0.0A | 20 | 0.0A |

| ENVIROTRACK | ASSET TRACK | HOME | POWERTALK | LOCKTALK | LOGOUT |
|---|---|---|---|---|---|

300d, 305

DATA CENTER EQUIPMENT CABINET INFORMATION CENTER AND UPDATEABLE ASSET TRACKING SYSTEM

REFERENCE TO RELATED APPLICATIONS

The present application is a continuation-in-part of Non-provisional application Ser. No. 14/168,753 which is a continuation of U.S. Non-Provisional application Ser. No. 13/954,473, filed Jul. 30, 2013, which claims the benefit of U.S. Provisional Patent Application Nos. 61/677,299, filed Jul. 30, 2012, 61/694,984, filed Aug. 30, 2012, whose disclosures are hereby incorporated by reference in their entireties into the present disclosure.

FIELD OF THE INVENTION

The present invention is directed to data center infrastructure management (DCIM) and more particularly to a cabinet information center (CIC) that provides a unified view for such management and an updateable asset tracking system.

BACKGROUND

Data center infrastructure management (DCIM) refers to the integration of information technology (IT) and facility management to centralize the monitoring and management of a data center's data computing systems. Generally, DCIM is achieved using specialized software, hardware, and sensors to enable a common, real-time monitoring and management platform for a variety of data computing systems.

Conventional server enclosures for connecting and managing one or more electronic server components include a frame or cabinet, such as an extruded aluminum frame, having a plurality of universal mounting rails for receiving the server components. The server cabinet may also include a door made using a variety of materials or venting options to allow for increased airflow to cool interior server components.

In addition to the cabinet itself, many conventional server enclosures include specialized subsystems for providing additional monitoring or control for various conditions that may affect the servers located within the enclosure. For example, these subsystems may include asset management for tracking whether a server component is located within the enclosure, access control for preventing unwanted physical intrusion or tampering with the components within the enclosure, environmental monitoring for maintaining desired operational temperatures, and power management for managing power distribution to components in the enclosure.

One disadvantage associated with conventional enclosures is that none of them provide an integrated enclosure that consolidates all of these functionalities in a way that eases integration and configuration of the enclosure within an IT infrastructure. For example, locks can be electronic or keyed and are either standalone or networked-proprietary, but do not communicate with other systems. Environmental installations are also often a separate solution from the other automation components in the enclosure. Power monitoring, control, and reporting are typically performed through on-board intelligence located within the power distribution units themselves.

Another disadvantage associated with conventional enclosures is that none provide a single network connection to manage these functions. Because each subsystem is typically managed using a separate network connection, a fully loaded enclosure may require many network connections (e.g., IP addresses, Ethernet cables, network ports). These extra network connections associated with conventional un-consolidated enclosures lead to added time and expense required to implement and manage such systems.

Two types of DCIM offerings now exist in the market. The first is software suites that integrate multiple functions. The second is point solutions, which are focused on individual functions. However, a solution that is integrated at the hardware level is lacking. Data center command center/control center consoles can obtain some information about data center conditions but typically cannot ascertain in-rack information.

None of the conventional devices described above provide an integrated DCIM equipment cabinet that consolidates a variety of equipment monitoring and control functions while making the cabinet cheaper and easier to manage by providing a single network connection to the appliance. Instead, conventional devices may only consolidate one or a few types of monitoring or control functions and may provide a separate network connection for each of these functions, thus making conventional cabinets expensive and difficult to manage.

SUMMARY OF THE INVENTION

In an embodiment the invention consolidates a variety of equipment monitoring and control functions while making the cabinet easier and less expensive to manage. The invention may provide the possibility of a single network connection for the variety of equipment monitoring and control functions.

In an embodiment, the present invention is directed to an integrated data center infrastructure management equipment cabinet appliance. The integrated appliance includes a cabinet frame enclosure for accommodating a plurality of equipment. The integrated appliance also includes at least one functional module selected from a group consisting of: an asset tracking module, an access control module, an environmental management module, and a power management module. The asset tracking module can automatically detect the presence or absence of equipment from the interior space of the cabinet frame enclosure using one or more near-field radio frequency identification (RFID) or other wireless sensors. The access control module provides electronic locking and access control to the interior space of the cabinet frame enclosure. The environmental management module monitors and controls environmental conditions within the interior space of the cabinet frame enclosure. The power management module monitors and controls power distribution to equipment located in the interior space of the cabinet frame enclosure. The integrated appliance also includes a cabinet control module (CCM) that provides consolidated connectivity to the one or more functional modules. In one illustrative embodiment, the CCM presents a single network connection, e.g., a single external Internet Protocol (IP) address, for managing the equipment located in the cabinet frame enclosure.

The data center equipment cabinet appliance (ECA), integrates an array of electronic sensors and controls to both standard and purpose built data center equipment cabinets. The focus of the ECA implementation is to improve operational efficiencies, reduce costs and protect assets typically installed within standard equipment cabinets utilized in data centers by providing a common point of information display and cabinet interaction without the need to physically access assets and vital sensory components internal to the equipment cabinet itself. Equipment can include any standard rack mount devices such as servers, storage arrays and networking devices.

The ECA is a DCIM implementation focused on providing an interactive interface for monitoring and/or controlling environmental (temperature, pressure, airflow, humidity), power (powerstrip/distribution unit) monitoring and control, asset tracking via automated in-cabinet detection, access management through a range of on-screen or other authentication mechanisms to electronic locks, and image based camera surveillance for identification and event logging. ECA cabinets can also include on cabinet display and touchscreen/keyboard interaction for at cabinet interrogation and interaction.

The ECA touchscreen display is integrated with the equipment cabinet's door design and provides ease of visual display to the aforementioned ECA sensor functions as well as touch interaction for information drilling, cabinet access via optional on-screen keypad authentication, and optional keyboard-video-mouse (KVM) interaction for "touch-free" in-cabinet asset administration. The ECA applies touchscreen and information display technology to data center equipment cabinets. The technology has to date not been applied to the monitoring and interaction with equipment cabinets in data centers.

The ECA controller provides electronic integration with the ECA for video and touch processing offload.

The ECA is driven by a "cabinet control module" (CCM) that consolidates all ECA monitoring and control functions, delivery network connectivity for the ECA automation through a single Ethernet or other network connection. The CCM has the unique ability to auto-detect the ECA subcomponents that are connected to it dynamically. This greatly eases integration and configuration. The controller offloads key graphic display and touch control processing from the cabinet control module (CCM).

The CCM is a single unit that provides connectivity for all sensor/control components listed below and delivers single point Ethernet (or any other suitable networking protocol) based network, connectivity to the ECA. This single-point consolidation is significant to data center managers, since it provides a single IP address or other network connection to manage a multitude of ECA functions.

The Asset-Track sensor units are installed into the ECA at each equipment mounting location (rack unit or RU). The Asset-Track sensor units preferably detect the installation or removal of assets wirelessly, for example, by detecting RFID tags placed on the assets. Other in-rack asset detection implementations exist but require physical connections between sensors and the actual equipment assets being monitored, thereby leading to the possibility of errors in reading accuracy and missing asset installation or removal events. Each asset can have an asset RFID tag attached thereto prior to installation and typically performed as a nominal part of equipment delivery and registration.

The Lock-Talk access control components provide electronic locking and access control to the ECA via third-party electronic locks. Access methods available for customer choice include a touch-sensor-based ten-key keypad for PIN access and door unit selection, a proximity card reader for use of key fob or keycard access, on-screen touchscreen control, remote network control, and/or biometric access. Lock-Talk also optionally integrates image based controls via camera still and video technologies.

Enviro-Track provides sensing of temperature, humidity, airflow, and air pressure for the ECA in order to assess its environmental conditions. In appropriately equipped ECA cabinets, Enviro-Track can also control airflow fan speeds and cabinet mounted cooling components. Environmental sensor functions via Enviro-Track are traditional and expected in accordance with industry ASHRAE standards. Unique control of cabinet mounted fans and cooling systems along with the unique integration of the environmental components with the rest of the appliance functions.

Power-Talk provides sensing, reporting and control over power elements supplied to the CA via power distribution units (PDUs), powerstrips, and intelligent power battery backup devices. Power-Talk integrates intelligent PDU functions for monitoring and selective control of power-strip outlets and battery control for backup or selective power increases. Power-Talk is a unique solution traditionally performed on-board intelligent power distribution units or intelligent powerstrips. By using Power-Talk, a multitude of 3rd party PDU components can be controlled and leveraged via the single Ethernet connection versus taking up an additional network connection in the datacenter.

The ECA Information Center includes a touchscreen and information display that provides external cabinet interaction to the above ECA information and control functions.

Each of the above elements is modular and customizable as packages depending on customer requirements. As elements are added to the ECA implementation, the CCM auto-discovers the ECA functions that it can manage.

Each package in the ECA distinctly manages its particular discipline; e.g., Lock-Talk is focused on authentication and access while Asset-Track is focused on asset tracking. The uniqueness to the approach is delivered via correlated automation scenarios as follows:

A. Authentication to access inside the cabinet may be granted to only those who are authorized to access the specific assets contained in the cabinet.
B. Temperature variance or other environmental factors may lead to the need to unlock and open the doors for additional airflow.
C. Certain assets identified via Asset-Track may have specific power ramp up profiles based on workload that may need to be coordinated with Power-Talk.
D. Asset locations, power profiles at the asset locations planned along with environmental profiles can be analyzed for efficiency optimization.

Each of the packages could make use of alternative components to achieve the same respective functional results.

A. Asset-Track is unique with respect to its use of nearfield RFID or other wireless technology and corresponding equipment tags. Other asset tracking solutions make use of tethered sensors or embedded sensors in power cables to sense the presence of assets. They could be substituted for the wireless approach but are deemed inferior in their ability to attest to the asset's presence or absence. This is due to the fact that an asset could be present and simply not tethered to the asset sensor in the first configuration or simply not plugged in where power cables are used with sensors.
B. Lock-Talk can make use of third-party electronic locks that are configured to interact with the CCM. The associated Lock-Talk authentication mechanisms such as Methode's touch-sensor-based keypad, Southco's integrated lock and proximity reader, and Lumidigm's biometric scanner are integrated and configured to maximize their performance with the CCM. Alternative keypads, proximity readers, and biometric devices could be interfaced to interact with the CCM architecture as well.
C. Enviro-Track sensors are very common sensor devices that are readily integrated to the CCM sensing and control logic. Method has developed its own cabling and sensing thermistors for the actual measurement of temperature in the solution.

D. Power-Talk speaks to a range of 3rd party PDU strips for gathering key power performance data. Power-Talk uniquely integrates to a new line of intelligent in-rack battery devices that will be capable of providing dynamic power peaking without the need to supply additional external power.

The ECA package provides real time cabinet sensory and control display and interaction by connecting to the CCM for information query and output to the ECA controller for graphics rendering and touch interaction.

The ECA process is set to poll for status updates on key value intervals in order to update sensor elements such as Temperature; Humidity; Airflow; AirPressure; Front and Rear Cabinet Door Lock state; Incoming cabinet power state; Outlet power state; Outlet power control; Power bank control; Power bank state; Asset presence or absence by rack unit state; Asset movement events; Cabinet authentication via on screen keypad; and Optional KVM integration for in-cabinet asset administration without the need to physically touch the assets being administered.

Alternatives would include remote access to similar information or large display screen technology utilized in control rooms and command centers. Equipment cabinets from third-party manufacturers may be optimized to integrate the CIC into their cabinet design. The present invention can be used on any type of equipment cabinet commonly used in datacenters, production studios, home theaters, broadcast facilities, etc. Adaptations can be produced to also address medical arenas such as a pharmacy.

The software can be Linux-based for ease of development, lower barrier of entry, and greater compatibility with various database engines. The software can include a Ruby on Rails software engine and a Web interface implemented through Adobe Flash. Integration options for third-party software suites can be provided. The present invention can be implemented in new cabinet enclosures or retrofitted to existing cabinet enclosures.

An embodiment of the invention provides a self-contained and self-monitoring equipment rack comprising a cabinet frame enclosure having a first side wall, a second side wall, a first opening and a second opening each in combination defining an interior space for accommodating a plurality of equipment. The equipment may be removable through the first opening. A first component is disposed in the first sidewall for wirelessly detecting the presence of at least one of the equipment. A second component is provided for locking a door of the cabinet, the second component controlled remotely and electronically. A third component having a temperature sensor is provided including a fan and a remote control for controlling temperature within the cabinet. A fourth component is disposed in the first or second side wall for providing power to the entire cabinet and each of its first, second and third components via a single power cable. Each of the first, second and third components are connected to the fourth component. A cabinet control module (CCM) is connected to each of the first, second, third and fourth components and the CCM for consolidating the monitoring and control of the first, second, third and fourth components. A display screen is linked to the CCM for viewing component operation data and controlling the CCM. The display screen accessible from outside the cabinet without opening the door.

Another embodiment of the invention provides a data center infrastructure management equipment cabinet appliance, the appliance comprising a cabinet frame enclosure having a first side wall, a second side wall, a first opening and a second opening each in combination defining an interior space for accommodating a plurality of equipment, the equipment being removable through the first opening. The appliance includes a plurality of functional modules selected from a group consisting of an updatable asset tracking module for detecting the presence or absence of the equipment from the interior space of the cabinet frame enclosure including a tag information file that identifies the equipment, the updatable asset tracking module capable of writing to an equipment tag to enable modification of the tag information file when the equipment is relocated, an access control module for providing electronic locking and access control to the interior space of the cabinet frame enclosure, an environmental management module for monitoring and controlling environmental conditions within the interior space of the cabinet frame enclosure, a power management module for monitoring and controlling power distribution to equipment located in the interior space of the cabinet frame enclosure, the power management module disposed in one of the first side wall or second side wall and adjacent the second opening and a cabinet control module (CCM) for providing consolidated connectivity to the plurality of functional modules, wherein the CCM presents a single network connection for managing the equipment located in the cabinet frame enclosure.

In an embodiment, the updateable asset tracking module is configured to detect the equipment wirelessly and an RFID tag attached to the equipment. In an embodiment, the updateable asset tracking module is configured to write to one or more RFID tags attached to the equipment. In an embodiment, the updateable asset tracking module comprises one or more RFID readers provided by a detachable strip located within the interior space of the cabinet frame enclosure. In an embodiment, the updateable asset tracking module further comprises a plurality of blocks connected in series and each block containing at least one RFID reader. In an embodiment, each block includes a male end and an opposite female end so that corresponding blocks may be interconnected to form a strip. In an embodiment, the access control module comprises one of: a touch-sensor-based key keypad, a proximity card reader, an on-screen touch-screen control, a remote network control, and biometric access. In an embodiment, the access control module is configured to use visual data including at least one of still images and video. In an embodiment, the environmental management module includes one of a fan and a dehumidifier for controlling one of airflow and humidity within the interior space of the cabinet frame enclosure. In an embodiment, the power management module comprises one or more of: a power distribution unit (PDU), a power strip, and an intelligent power battery backup device. In an embodiment, the power management module is configured to selectively control at least one of power delivery and power storage to the equipment. In an embodiment, the cabinet control module is wirelessly connect to the plurality of functional modules. In an embodiment, the cabinet control module is wired to the plurality of functional modules. In an embodiment, the cabinet control module comprises a touch-screen display for providing external user interaction between a user and the integrated appliance. In an embodiment, the cabinet control module is configured to manage a correlated automation scenario where information received from at least a first functional module is used to manage at least a second functional module. In an embodiment, the single network connection has a single IP address.

Another embodiment of the invention includes a self-contained and self-monitoring equipment rack comprising a cabinet frame enclosure having a first side wall, a second side wall, a first opening and a second opening each in combination defining an interior space for accommodating a plurality of equipment, the equipment being removable through the first opening, a first component disposed in the first sidewall for wirelessly detecting the presence of at least one of the equipment, the first component including a tag information file that identifies the equipment and having a read and write capability to enable modification of the tag information file when the equipment is relocated; a second component for locking a door of the cabinet, the second component controlled remotely and electronically, a third component having a temperature sensor and a fan and a remote control for controlling temperature within the cabinet. The invention provides a fourth component disposed in the first or second sidewall for providing power to the entire cabinet and each of its first, second and third components via a single power cable, each of the first, second and third components connected to the fourth component; a cabinet control module (CCM) connected to each of the first, second, third and fourth components and the CCM for consolidating the monitoring and control of the first, second, third and fourth components. The invention includes a display screen linked to the CCM for viewing component operation data and controlling the CCM, the display screen accessible from outside the cabinet without opening the door.

In an embodiment, the first component includes an asset tracking module that is configured to detect one or more RFID tags attached to the equipment.

In an alternate embodiment, the invention provides an updateable asset tracking system comprising a cabinet frame enclosure having a first side wall, a second side wall, a first opening and a second opening each in combination defining an interior space for accommodating a plurality of equipment, the equipment being removable through the first opening, a first component disposed in the first sidewall for wirelessly detecting the presence of at least one of the equipment, the first component including a tag information file that identifies the equipment and having a read and write capability to enable modification of the tag information file when the equipment is relocated; a second component disposed in the second sidewall for wirelessly detecting the presence of at least one of the equipment, the second component including a tag information file that identifies the equipment and having a capability to enable modification of the tag information file when the equipment is relocated. In an embodiment, the first and second component each include an RFID reader having a capability to write to an RFID tag mounted to the equipment. In an embodiment, a third component located below the first component in the first sidewall for wirelessly detecting the presence of at least one of the equipment.

BRIEF DESCRIPTION OF THE DRAWINGS

An embodiment of the present invention will be set forth in detail with reference to the drawings, in which:

FIGS. 14-19 are exemplary depictions of screen shots depicting the information available via the cabinet information center.

Figure 1:
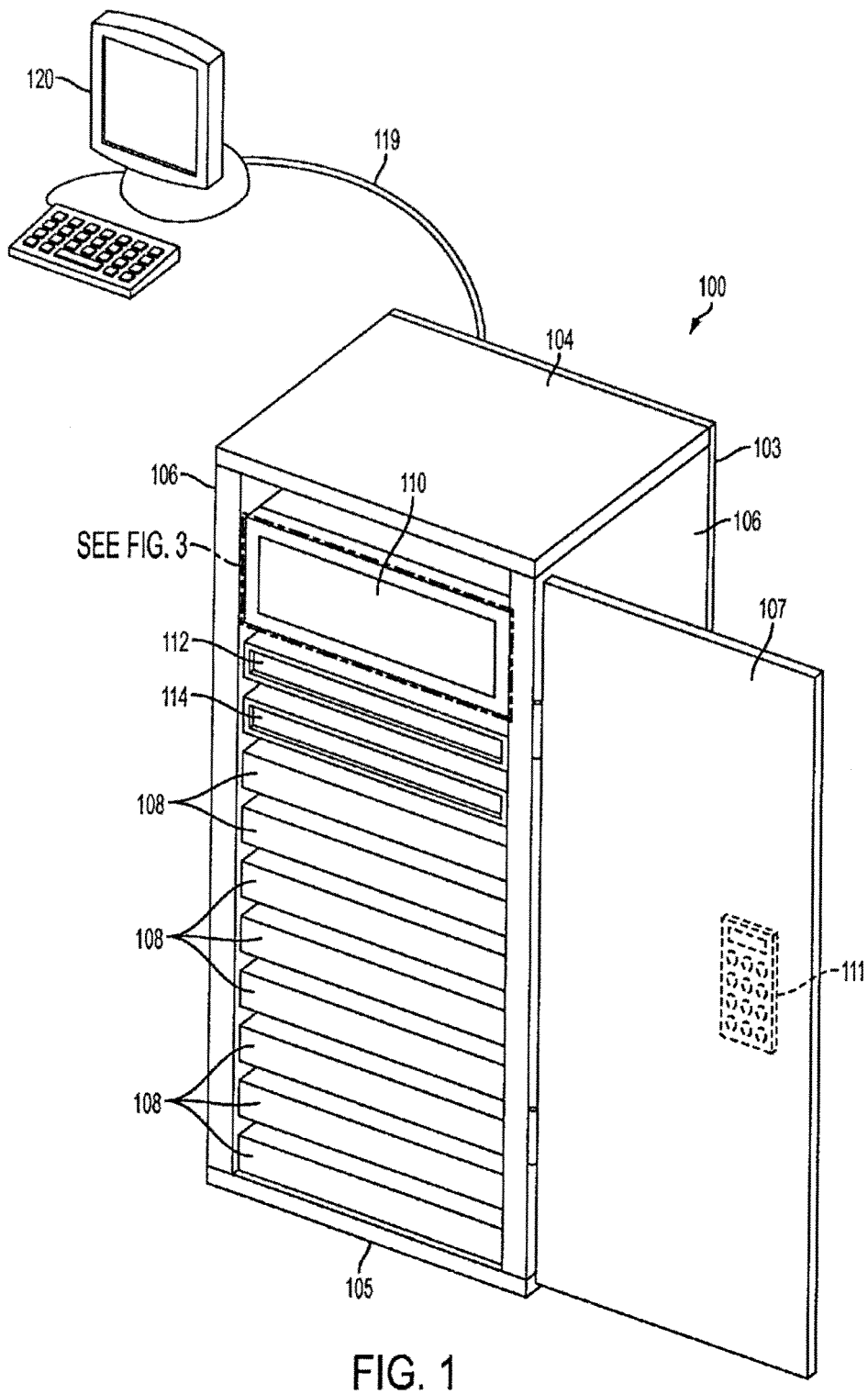
FIG. 1 is a front perspective view of an exemplary system including an integrated data center infrastructure management equipment cabinet appliance, in accordance with an exemplary embodiment of the present invention.

While the invention is amenable to various modifications and alternate forms, specific embodiments have been shown by way of example in the drawings and will be described in detail below. Disclosure of such specific embodiments shall not limit the invention to the particular embodiments depicted in the drawing figures. This application shall cover all modifications, equivalents and alternatives falling within the spirit and the scope of the invention.

DETAILED DESCRIPTION

Figure 2:
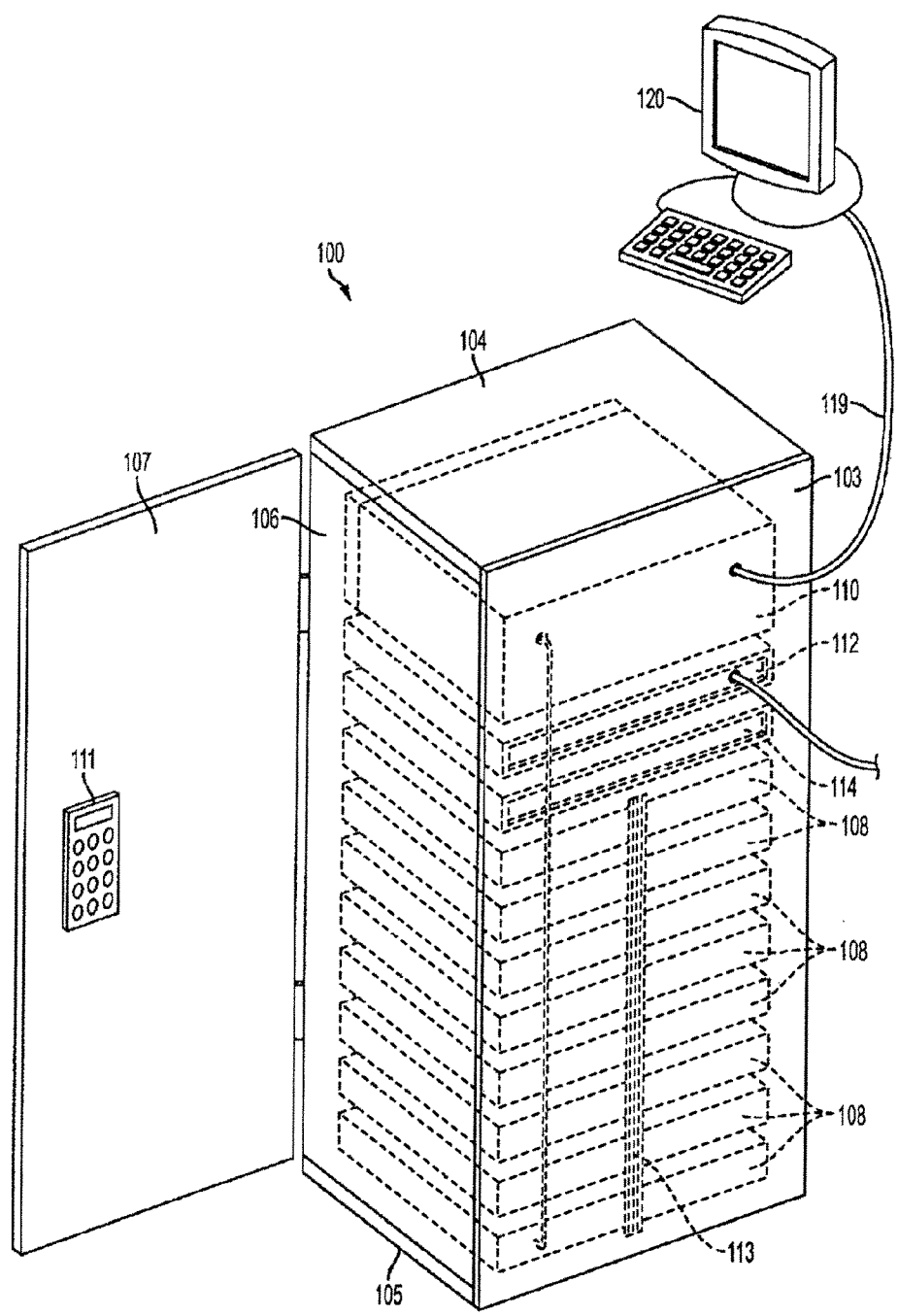
FIG. 2 is a side perspective view of an exemplary system including an integrated data center infrastructure management equipment cabinet appliance, in accordance with an exemplary embodiment of the present invention.

An embodiment of the invention will be set forth in detail with reference to drawing FIGS. 1-6, in which like reference numerals refer to like elements or steps throughout. FIGS. 1 and 2 show an exemplary system including an integrated data center infrastructure management equipment cabinet appliance in accordance with an embodiment of the subject matter described herein. In FIGS. 1 and 2, dashed lines are shown to illustrate components that may not be visible from the given perspective. For example, the equipment cabinet appliance (ECA) 100 includes a completely enclosable/sealable enclosure, and therefore, the front door 107 is shown in an open position in FIG. 1 in order to more clearly illustrate the various internal components of the ECA 100. Because the back panel of the ECA 100 is not removable in the embodiment shown, FIG. 2 provides additional illustration of the components and/or connections which are located inside the ECA 100 and between the back panel of the ECA 100 and the back portions of the various components in the ECA 100.

The ECA 100 includes a cabinet frame 102 for storing, connecting, monitoring, and managing a plurality of servers, such as servers 108. The servers 108 may, for example, be 1U format server blades configured to perform functions desired by the user. In addition to the servers 108, the ECA 100 includes a cabinet control module (CCM) 110 for managing one or more functional modules 111-114 which provide one of: asset tracking, access control, environmental management, and power management. The functional modules 111-114 are managed using the central, dedicated CCM 110 which provides a single network access connection to the ECA 100. By integrating multiple features provided by the functional modules 111-114 in a single enclosure and managing those features using a single external network connection, the integration and configuration of this DCIM implementation is easier and cheaper than with conventional devices. For the reasons stated above which distinguish the ECA 100 from conventional equipment enclosures, the ECA 100 of the present invention may be referred to as an "appliance" rather than just a rack, cabinet, or enclosure. Additional details of the ECA 100 will now be described in greater detail below.

Cabinet Frame:

The cabinet frame 102 accommodates a plurality of equipment, where the cabinet frame 102 has a top wall 104 and a bottom wall 105 that is located opposite the top wall 104. The cabinet frame enclosure 102 also includes two sidewalls 106 connected between two corresponding opposite sides of the top 104 and the bottom 105 walls and a back wall (not shown) connected between the top 104 and the bottom 105 and the sidewalls 106. Finally, the cabinet frame enclosure 102 includes a front door panel 107 located opposite the back wall (not shown), thereby defining an interior space for accommodating the equipment therein.

It is appreciated that the cabinet frame 102 may include a standardized frame or enclosure for mounting multiple equipment modules, where each module has a front panel that is a standard dimension (e.g., 19 inches wide), and may include edges that protrude on each side to allow for modules to be fastened to the rack frame. Equipment designed to be placed in the cabinet frame 102 may be described as rack-mount, rack-mount instrument, a rack mounted system, a rack mount chassis, subrack, rack mountable, or occasionally simply shelf. The height of the electronic modules may also have standardized dimensions (e.g., as multiples of 1.75 inches or one rack unit or U). An industry-standard rack cabinet may be approximately 42U-44U tall. Rack-mountable equipment is traditionally mounted by bolting or clipping its front panel to the rack. Heavy equipment or equipment which is commonly accessed for servicing, for which attaching or detaching at all four corners simultaneously would pose a problem, is often not mounted directly onto the rack but instead is mounted via rails (or slides). A pair of rails is mounted directly onto the rack, and the equipment then slides into the rack along the rails, which support it. When in place, the equipment may also then be bolted to the rack. The rails may also be able to fully support the equipment in a position where it has been slid clear of the rack, which may be useful for inspection or maintenance of equipment which will then be slid back into the rack. Thus, the cabinet frame 102 can be used with any type of equipment commonly used in datacenters, production studios, home theaters, broadcast facilities, etc. Adaptations may be used to address medical applications, such as for a pharmacy, which may have different requirements.

Each of the functional modules 111-114 will now be described in greater detail below. It is appreciated that any combination of one or more of the functional modules 111-114 may be present in the ECA 100 without departing from the scope of the subject matter described herein. Further, the functional modules 111-114 may include multiple components such as sensors, control systems, fans, and associated processors, memory, and software. Thus, the term "module" is not intended to be limited to any specific component(s) illustrated in the exemplary embodiments described below, but rather may refer to any combination of components associated with providing the functionality described.

Access Control Module:

The access control module 111 provides electronic locking and access control to the interior space of the cabinet frame 102. For example, the access control module 111 may include a keypad, a proximity card, biometric pad, or any other suitable means for controlling physical access to the cabinet frame 102. In one embodiment, the access control module 111 provides electronic locking and access control to the ECA 100 via third party electronic locks.

Access methods available for control may be chosen by the user and can include: a touchsensor-based key keypad for pin access and door unit selection, a proximity card reader for use of keyfob or keycard access, an on-screen touchscreen control, a remote network control, and/or biometric access. It is appreciated that the access control module 111 may also optionally integrate image-based controls including those using camera (still and video) technologies. It is further appreciated that the access control module 111 can make use of third party electronic locks that are specifically configured to interact with the CCM 110. These may include certain touchsensor based keypads produced by Methode Inc., certain integrated locks and proximity readers produced by Southco Inc., and certain biometric scanners produced by Lumidigm Inc., each of which have been integrated and configured to maximize their performance with the CCM 110.

Power Management Module:

The power management module 112 monitors and controls power distribution to equipment 108 located in the interior space of the cabinet frame 102. For example, the power management module 112 provides sensing, reporting and control over power elements supplied to the ECA 100 via power distribution units (PDUs), powerstrips, and intelligent power battery backup devices. The power management module 112 may integrate intelligent PDU functions for monitoring and selective control of powerstrip outlets and battery control for backup or selective power increases using on-board intelligent power distribution units or intelligent powerstrips. By using the power management module 112, a multitude of third-party PDU components can be controlled and leveraged via the single Ethernet connection 119 versus taking up an additional network connection in the datacenter. It is appreciated that a range of third party PDU strips may be used for gathering key power performance data. Additionally, the power management module 112 may integrate with intelligent in-rack battery devices capable of providing dynamic power peaking without the need to supply additional external power.

Asset Tracking Module:

The asset tracking module 113 automatically detects the presence or absence of equipment, such as servers 108, from the interior space of the cabinet frame 102 using one or more nearfield radio frequency identification (RFID) sensors. In one embodiment, the asset tracking module 113 may include one or more RFID tags attached to each of the assets 108 to be tracked and a corresponding RFID reader located inside of the cabinet frame 102. More specifically, the RFID reader may include a plurality of individual RFID readers that are connected in series and vertically mounted to the back 103 and/or side walls 106 of the cabinet frame 102, as illustrated in FIG. 2.

In one embodiment, the asset tracking module 113 may be installed in the ECA 100 at each equipment mounting location (rack unit or U). The asset tracking module 113 automatically detects the installation or removal of assets 108 installed within the ECA 100 rack unit locations via nearfield RFID technology. It is appreciated that the asset tracking module 113 is not intended to be limited to a specific implementation or configuration; however, successful detection of the asset tags may require that the distance between the asset tag and the asset reader not exceed a predetermined distance (e.g., 20 mm). Additionally, some parts of the cabinet frame 102, such as those parts located between the nearfield antenna/reader and the asset tag it is attempting to read, may be made of a nonmetal material in order to avoid interfering with the wireless communication between the tag and the reader.

It is appreciated that while other conventional in-rack asset detection implementations exist, they often require physical connections to be present between sensors and the assets being monitored, thereby leading to the possibility of errors in reading accuracy and missing asset installation or removal events. Here, each asset only requires an asset RFID tag to be attached to the equipment prior to installation and is typically performed as a normal part of equipment delivery and registration.

Environmental Management Module:

The environmental management module 114 monitors and controls environmental conditions within the interior space of the cabinet frame enclosure. For example, the environmental management module 114 provides sensing of temperature, humidity, airflow, and air pressure for the ECA 100 in order to assess its environmental conditions. In an appropriately equipped ECA cabinet frame 102, the environmental management module 114 can also control airflow fan speeds and cabinet mounted cooling components, such as servers 108, in accordance with industry standards. The sensor devices associated with the environmental management module 114 may be integrated with the CCM 110 sensing and control logic, which will be described in greater detail below with respect to the CCM 110. In one embodiment, the environmental sensors may include specialized cabling and sensing thermistors for performing measurement of temperature.

Cabinet Control Module (CCM):

The cabinet control module (CCM) 110 provides consolidated connectivity to the one or more functional modules 111-114, where the CCM 110 presents a single external network connection 119 (e.g., Internet Protocol (IP) address) for managing the equipment 108 associated with the ECA 100.

The CCM 110 provides a single unit that provides connectivity for all sensor/control components listed below and delivers single point Ethernet based network connectivity to the ECA 100. This single point consolidation is significant to data center managers since it provides a single IP address to manage a multitude of ECA functions 111-114. The CCM 110 is capable of auto-discovering ECA components installed and consolidates all key ECA functions 111-114 to a single Ethernet connection to the external ECA environment, such as connection 119 to computer 120, thereby greatly reducing overall datacenter connectivity costs dedicated to monitoring and control.

Figure 3:
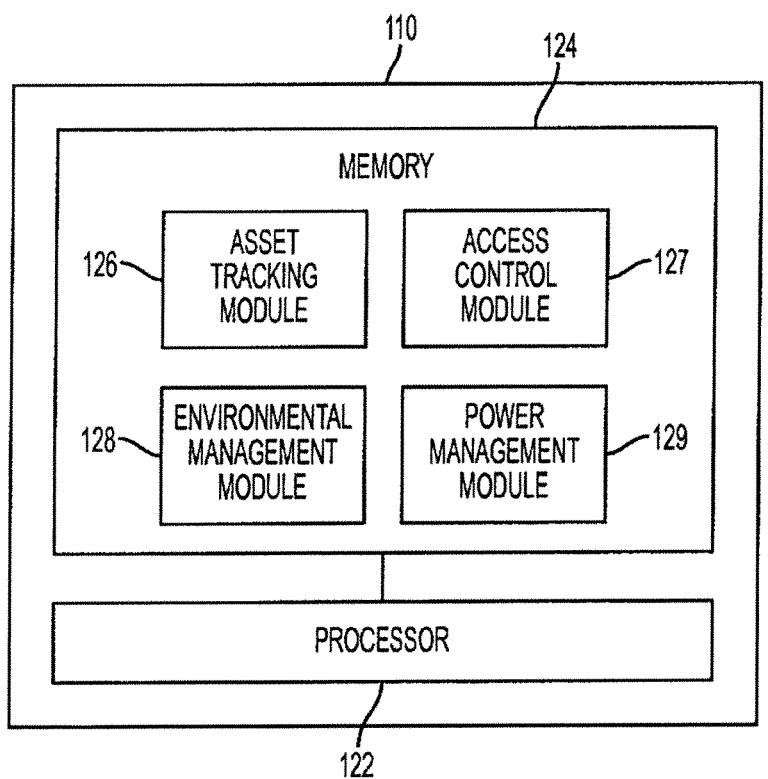
FIG. 3 is a schematic diagram of internal components of an exemplary cabinet control module for use in an integrated data center infrastructure management equipment cabinet appliance, in accordance with an exemplary embodiment of the present invention.

FIG. 3 is a schematic diagram of internal components of an exemplary cabinet control module for use in an integrated data center infrastructure management equipment cabinet appliance, in accordance with an exemplary embodiment of the present invention. Referring to FIG. 3, the CCM 110 includes a processor 122 and a memory 124 containing computer-readable and computer-executable instructions that, when executed by the processor 122, perform steps. The memory 124 includes an asset tracking software module 126, an access control software module 127, an environmental management software module 128, and a power management software module 129.

Each of the software modules 126-129 may be associated with one or more respective physical devices located in the ECA 100, such as sensors, fans, locks, or batteries for performing various monitoring, control, or management functions. For example, the asset tracking software module 126 may be associated with (e.g., communicatively or otherwise connected to) the RFID reader 113 for detecting the corresponding RFID tags located on each of the servers 108. The access control software module 127 may be associated with the access control module 111, which may include a keypad, proximity card reader, biometric access lock etc. The access control software module 127 may record the date and time of each successful or failed access attempt along with the identity of the user. The environmental management software module 128 may be associated with a plurality of environmental sensors and control devices shown for simplicity as environmental module 114. Thus, the environmental management software module 128 may receive environmental data, such as temperature, humidity, airflow, etc., from the sensors of the environmental management module 114. The environmental management software module 128 may also send control signals to one or more environmental control devices, such as fans, dehumidifiers, water pumps, etc., for adjusting one or more of the monitored environmental factors inside the ECA 100. Finally, the power management software module 129 may be associated with the power management module 112, such as power backup batteries, power strips, or other power-related devices. The power management software module 129 can receive data from the power management module 112 for monitoring the power consumption of the servers 108 by receiving data from a powerstrip, for providing failover battery backup protection from an alternate power source in the event that the primary power source is unavailable by sending a signal to the alternate power source, and for recording and reporting power-related data to computer 120.

Interaction of the Functional Modules:

As described above, the ECA 100 may include a plurality of functional modules 111-114 for providing asset tracking, access control, environmental management, and power management functions. Because each of these functional modules may be consolidated and coordinated using the CCM 110, various usage or automation scenarios may utilize the interdependence of these functional modules to further optimize the performance of the ECA 100. For example, various exemplary correlated automation scenarios are described below, but are not intended to be limiting.

A first correlated automation scenario includes combining access control and asset tracking, where access to the cabinet 102 may be granted only to users who are authorized to access one or more specific assets 108 contained in the cabinet frame 102.

Another correlated automation scenario includes combining environmental management and access control, where a temperature variance or other environmental factor may lead to the need to unlock and open the doors for additional airflow. Thus, access may be granted to the cabinet frame 102 based on an indication generated by the environmental monitoring module 114.

Another correlated automation scenario includes combining asset tracking and power management, where certain assets 108 identified via the asset tracking module 113 may be associated with a specific power ramp up profile based on workload that is coordinated with the power management module 112.

Another correlated automation scenario includes combining information from any or all of the functional modules 111-114 where, for example, the asset locations, power profiles for the assets/asset locations, environmental profiles/conditions for the assets/asset locations, and the access control for the cabinet frame 102 may be analyzed together in order to optimize the overall efficiency or performance of the ECA 100.

Hardware requirements will now be disclosed. While the preferred embodiment has the following server hardware requirements, different implementations can have different requirements, e.g., higher or lower requirements or the use of non-Intel processors. The server should be implemented on a dedicated machine with at least a quad-core Intel Xeon processor with a speed of at least 2.2 GHz, with at least 4 GB RAM and a 1 GB network interface card. Persistent storage should include a 10 k RPM RAID 5, 6, 10 array with at least three hard drives. For each application, add 1 GB RAM; for each two add-on applications, add one CPU core; for every 2,500 assets for 100 locks, add 250 MHz to the processor speed and 10 MB RAM. One server can access 16 SIRIT readers; for each additional SIRIT reader, add 15 MB RAM.

Figure 4:
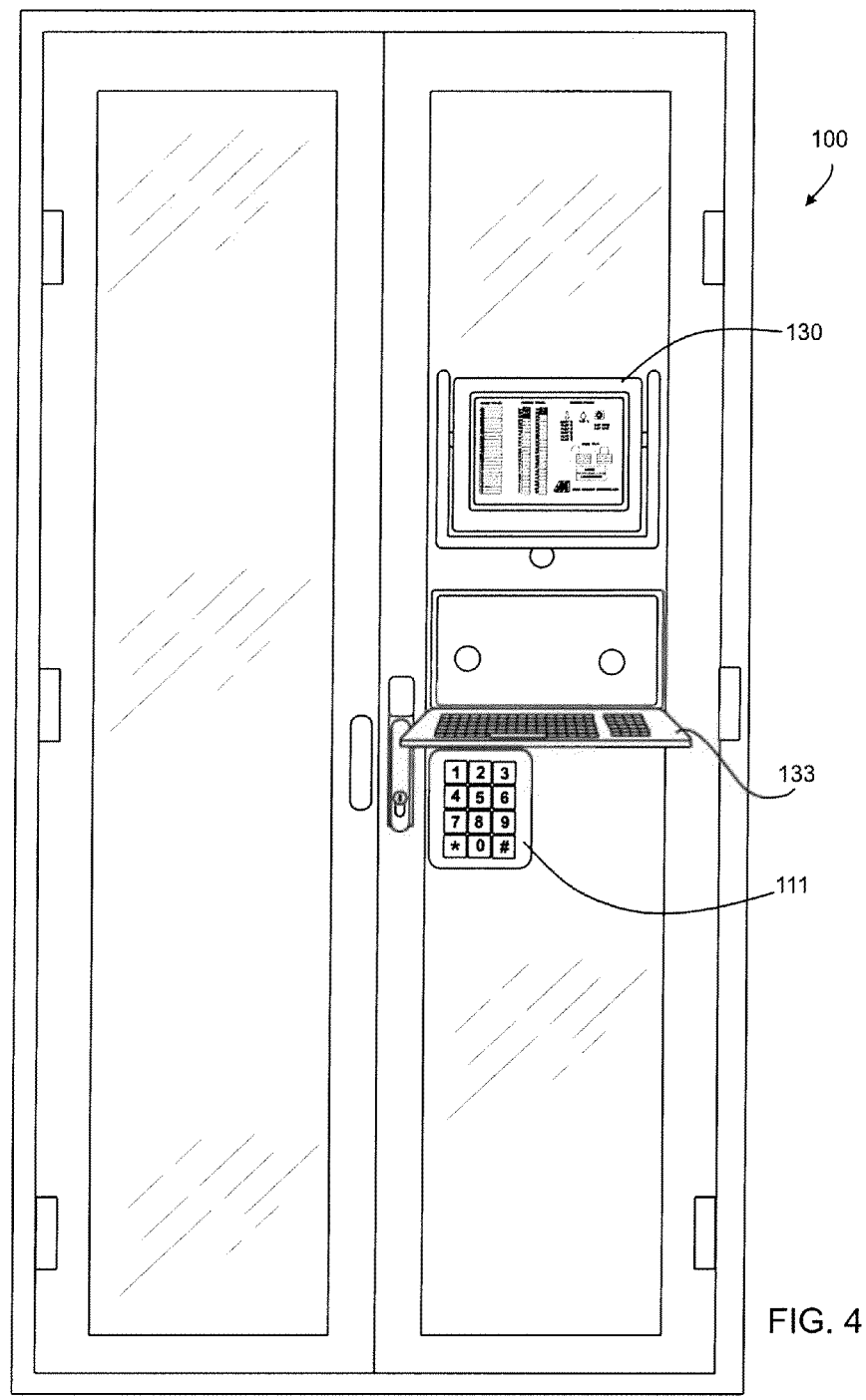
FIG. 4 is a front elevation view of an exemplary system including an equipment cabinet appliance.
Figure 5:
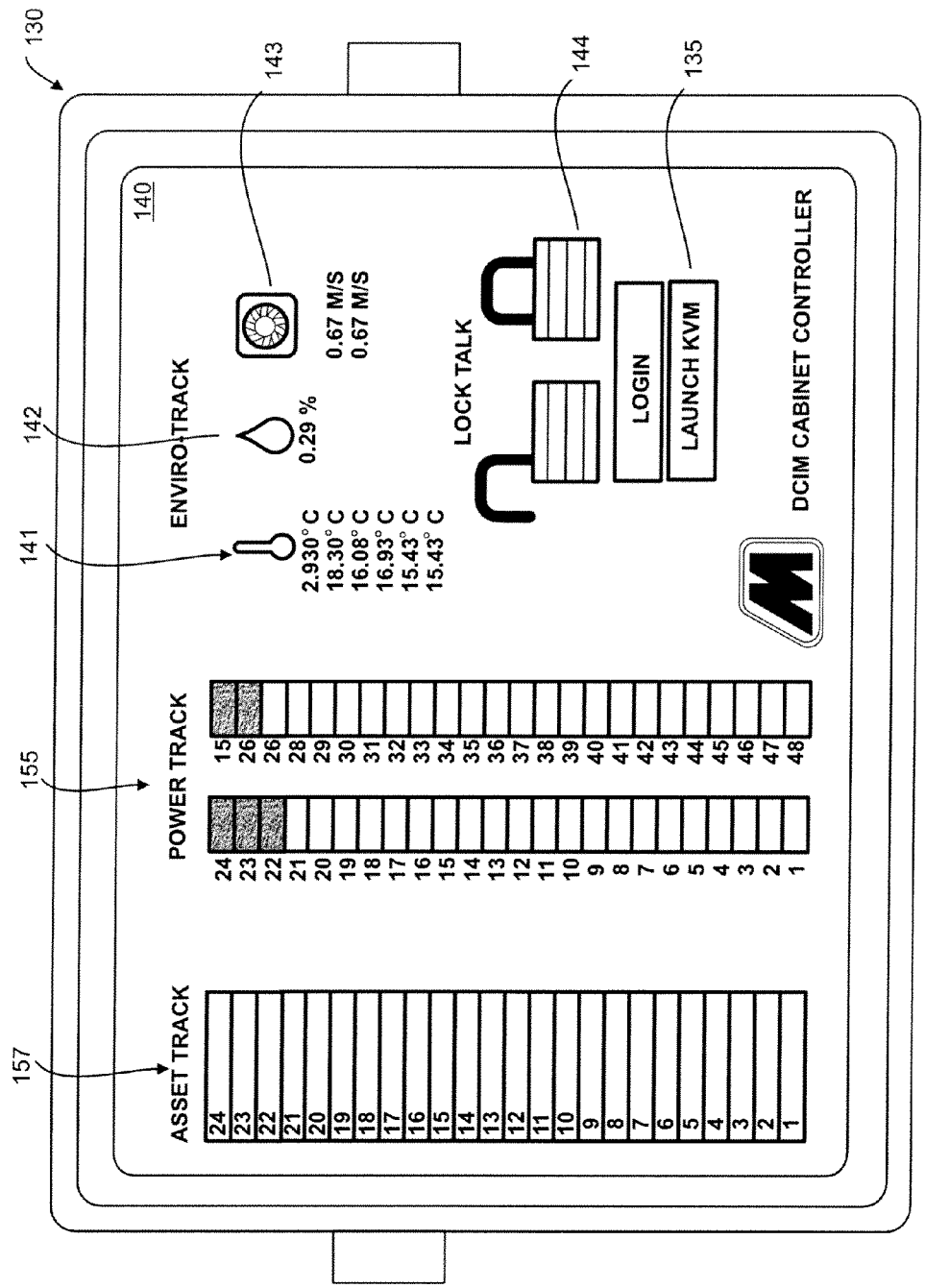
FIG. 5 is an enlarged plan view of a monitor depicting a preferred screen shot, the monitor depicted also in FIG. 4.

FIGS. 4-5 depict the data center equipment cabinet information center (CIC) 100 that provides a unified view of vital equipment cabinet sensor information as well as an interaction point for key cabinet control functions. The focus of the CIC implementation is to improve operational efficiencies, reduce costs and protect assets typically installed within standard equipment cabinets utilized in data centers by providing a common point of information display and cabinet interaction without the need to physically access assets and vital sensory components internal to the equipment cabinet itself.

CIC is defined as "data center infrastructure management" (DCIM) enabler and is focused on providing interactive interface with the monitoring and/or controlling of; environmental (temperature, pressure, airflow, humidity), power (powerstrip/distribution unit) monitoring and control, asset tracking via automated in cabinet detection, access management through on screen authentication mechanisms to electronic locks, and image based camera surveillance for identification and even logging. The CIC is driven by a "cabinet control module" 110 (FIG. 6) that presents all CIC monitoring and controls functions contained within the equipment cabinet.

Cabinet Control Module (CCM) 110 is a single unit that provides connectivity for all sensor/control components listed below and delivers single point Ethernet based network connectivity to the ECA. This single point consolidation is significant to data center managers since it provides a single IP address to manage a multitude of ECA functions including environmental, power, security and asset monitoring.

Cabinet Information Center (CIC) touchscreen display 130 which is integrated with the equipment cabinet's door 107 design and provides ease of visual display to the afore mentioned CCM sensor functions as well as touch interaction for information drilling, cabinet access via optional on-screen keypad authentication, and optional keyboard-video-mouse (KVM) (keyboard 133) interaction 135 for "touch-free" in-cabinet asset administration. Cabinet Information Center Controller provides electronic integration with the CCM for video and touch processing offload.

Cabinet Information Center (CIC) is an application of touchscreen and information display technology applied to data center equipment cabinets. The technology has to date not been applied to the monitoring and interaction with equipment cabinets in data centers.

Cabinet Information Center Controller (CICC) is a display and touchscreen processing electronics package that offloads key graphic display and touch control processing from the cabinet control module (CCM).

Turning to FIG. 5 the CIC package provides real time cabinet sensory and control display 140 and interaction by connecting to the CCM for information query and output to the CIC controller for graphics rendering and touch interaction. The CIC process is set to poll for status updates on key value intervals in order to update sensor elements such as: temperature 141; humidity 142, airflow, air pressure 143; front and rear cabinet door lock statues 144; incoming cabinet power state; outlet power state; outlet power control; power bank control; power bank state 155; and asset track 157. Alternatives would include remote access to similar information or large display screen technology utilized in control rooms and command centers. Equipment cabinets form third party manufactures may be optimized to integrate the CIC in their cabinet design.

Figure 6:
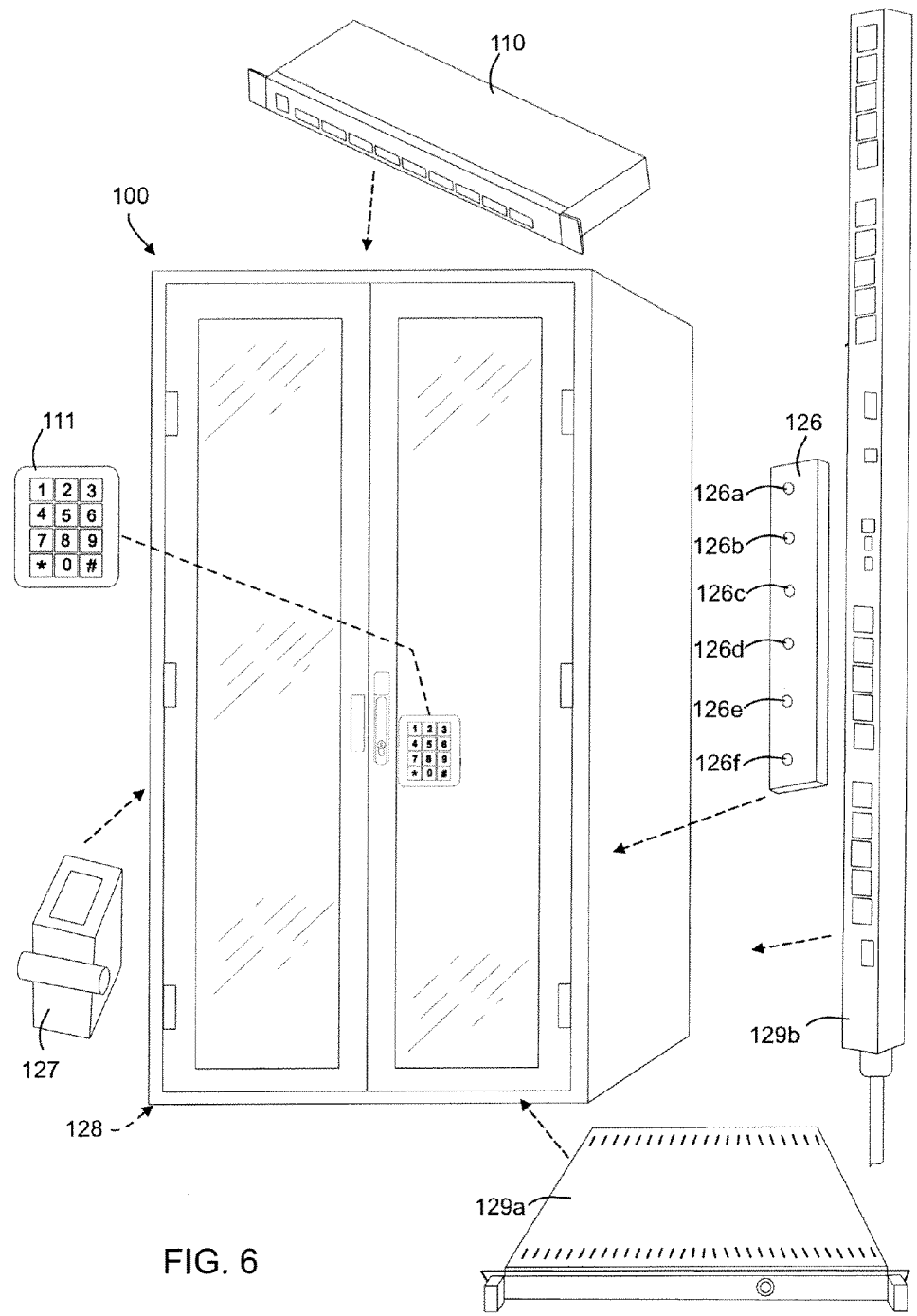
FIG. 6. is a front perspective, exploded view of the individual components of an equipment cabinet appliance of the present invention.

FIG. 6 depicts the data center equipment cabinet appliance (ECA) 100 that integrates an array of electronic sensors and controls to both standard and purpose built data center equipment cabinets. The focus of the ECA implementation is to improve operational efficiencies, reduce costs and protect assets typically installed within standard equipment cabinets utilized in data centers. Equipment can include any standard rack mount devices such as servers, storage arrays and networking devices.

ECA is defined as a "data center infrastructure management (DCIM) implementation and is focused on monitoring and/or controlling environmental (temperature, pressure, airflow, humidity), power (powerstrip/distribution unit) monitoring and control, asset tracking via automated in cabinet detection, access management through a range of authentication mechanisms to electronic locks, and image based camera surveillance for identification and even logging. ECA cabinets can also include on cabinet display and touchscreen/keyboard interaction for at cabinet interrogation and interaction.

The ECA is driven by a cabinet control module (CCM) 110 that consolidates ECA monitoring and control functions, delivery network connectivity for the ECA automation through a single Ethernet network connection. The CCM has the unique ability to auto-detect the ECA subcomponents that are connected to it dynamically. This greatly eases integration and configuration.

Cabinet Control Module (CCM) 110 is a single unit that provides connectivity for all sensor/control components listed below. In an embodiment the CCM 110 delivers single point Ethernet based network connectivity to the ECA. This single point consolidation is significant to data center managers since it provides a single IP address to manage a multitude of ECA functions. The CCM is required for any of the following ECA functions.

Asset-Track sensor units 126 are installed into the ECA at each equipment mounting location (rack unit or U). The Asset-Track sensors 126*a,b,c,d,e,f* automatically detect the installation or removal of assets installed within the ECA rack unit locations for example, via nearfield RFID technology.

Lock-Talk access control components 127 provide electronic locking and access control to the ECA via third party electronic locks. Access methods available for customer choice include touchsensor based 10 key keypad 111 for pin access and door unit selection, proximity card reader for use of keyfob or keycard access, on-screen touchscreen control, remote network control, and/or biometric access. Lock-Talk also optionally integrates image based controls via camera still and video technologies.

Enviro-Track 128 provides sensing of temperature, humidity, airflow, and airpressure for the ECA in order to assess its environmental conditions. In appropriately equipped ECA cabinets, Enviro-Track can also control airflow fan speeds and cabinet mounted cooling components.

Power-Talk 129*a* provides sensing, reporting and control over power elements supplied to the ECA via power distribution units (PDUs), powerstrips 129*b*, and intelligent power battery backup devices. Power-Talk 129*a* integrates intelligent PDU functions for monitoring and selective control of powerstrip outlets and battery control for backup or selective power increases.

ECA Information Center is a touchscreen and information display 130 that provides external cabinet interaction to the above ECA information and Control functions.

Each of the above elements are modular and customizable as packages depending on customer requirements. As elements are added to the ECA implementation, the CCM auto-discovers the ECA functions it can manage.

CCM is capable of auto-discovering ECA components installed. In an embodiment the ECA consolidates all key ECA functions to a single Ethernet connection and to the external ECA environment, thereby greatly reducing overall datacenter connectivity costs dedicated to monitoring and control of the ECA.

Asset-Track 126 auto-detects assets and installation and removal for example through nearfield RFID technology. Each asset may operate using an asset RFID tag to be attached to the equipment prior to installation into the ECA 100 and typically performed as a normal part of equipment delivery and registration.

Environmental sensor functions via Enviro-Track 128 are traditional and expected in accordance with industry ASHRAE standards. Unique control of cabinet mounted fans and cooling systems along with the unique integration of the environmental components with the rest of the appliance functions.

Power-Talk 129*a,b* is a unique solution traditionally performed on-board intelligent power distribution units or intelligent powerstrips. By using Power-Talk 129*a,b*, a multitude of third-party PDU components can be controlled and leveraged for example, via the single Ethernet connection versus taking up additional network connection in the datacenter.

Each package in the ECA 100 distinctly manages its particular discipline e.g. Lock-Talk 127 is focused on authentication and access while Asset-Track 126 is focused on asset tracking. The uniqueness to the approach is delivered via correlated automation scenarios as follows:

Authentication to access inside the cabinet may be granted to only those who are authorized to access the specific assets contained in the cabinet.

Temperature variance or other environmental factors may lead to the need to unlock and open the doors for additional airflow.

Certain assets identified via Asset-Track 126 may have specific power ramp up profiles based on workload that may need to be coordinated with Power-Talk 129*a,b*.

Each of the asset packages with the exception of Asset-Track 126 could make use of alternative components to achieve the same respective functional results.

Asset-Track 126 is unique with respect to is use of nearfield RFID technology and corresponding equipment tags. Other prior art asset tracking solutions make use of tethered sensors or embedded sensors in power cables to sense the presence of assets. They could be substituted for the nearfield RFID approach but are deemed inferior in their ability to attest to the asset's presence or absence. This is due to the fact that an asset could be present and simply not tethered to the asset sensor in the first configuration or simply not plugged in where power cables are used with sensors.

Lock-Talk 127 can make use of third-party electronic locks that are configured to interact with the CCM. The associated Lock-Talk 127 authentication mechanisms such as Methode Electronics, Inc.'s touchsensor based keypad, Southco's integrated lock and proximity reader, and Lumidigm's biometric scanner are integrated and configured to maximize their performance with the CCM. Alternative keypads, proximity readers, and biometric devices could be interfaced to interact with the CCM architecture as well.

Enviro-Track sensors 128 are sensor devices that are readily integrated to the CCM sensing and control logic. Methode Electronics, Inc. has developed its own cabling and sensing thermistors for the actual measurement of temperature in the present invention.

Power-Talk 129*a,b* speaks to a range of third-party PDU strips for gathering key power performance data. Power-Talk 129*a,b* uniquely integrates to a new line of intelligent in-rack battery devices that will be capable of providing dynamic power peaking without the need to supply additional external power. In an embodiment the Asset-Tracker sensor 126 may comprise a near field RFID reader. In an embodiment, the Asset-Track tag may comprise a near field RFID tag. In an embodiment, the Lock-Talk keypad 127 may comprise a keypad. In an embodiment, the Lock-Talk proximity card reader may comprise a proximity reader.

Each of the functional packages can be optionally installed. Integration with third-party functional versions of the packages is also considered for new as well as legacy installations.

Figure 7:
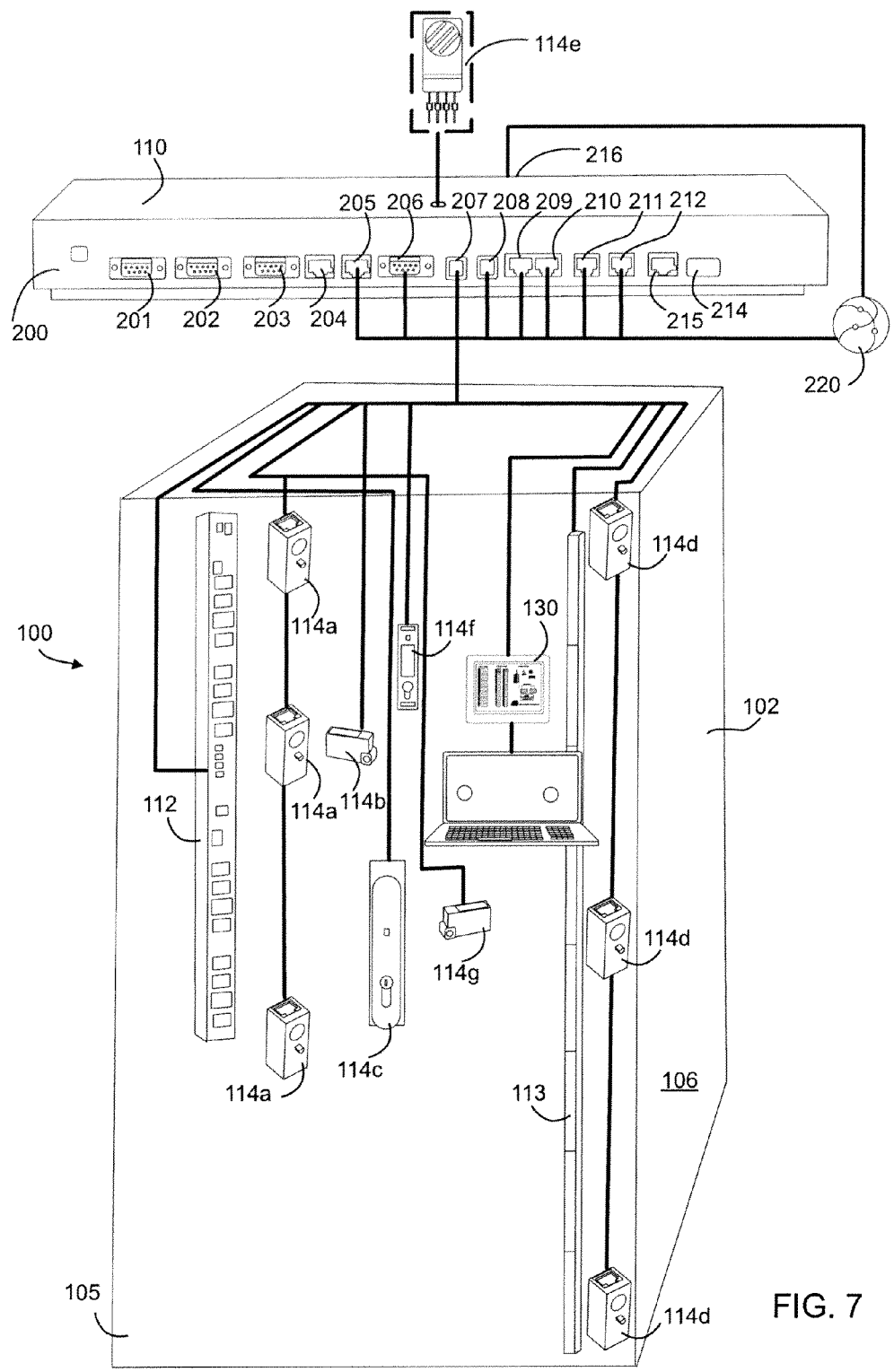
FIG. 7 is a perspective view of an illustrative depiction of the present invention displaying the components of the equipment cabinet appliance linked to a cabinet control module of the present invention.

Turning to FIG. 7, the ECA 100 is depicted in an illustrative view depicting each of the components of the ECA (located within the ECA in a location generally close to the actual mounting positions with the cabinet) and the links to the CCM. The CCM 100 includes a frame 102 defining a pair of sidewalls 106*a* front 105 (normally where the door is attached; however not depicted in the illustrative view of FIG. 7) and a rear opening 103 (not depicted).

As discussed above, the CCM will include assets or equipment 108 such as routers, hubs, or other type blade components mounted within the ECA 100. The CCM 110 is typically mounted within the ECA 100. However, FIG. 7 is an illustrative view focusing on the components within the ECA 100, so the CCM 110 is depicted separate from the ECA frame 102 and the links between each of the modules of the ECA can be understood and the integrated functionality of the CCM 110, further illustrated below.

The CCM 110, also known as a data center infrastructure management controller, includes input ports 201-214. An auxiliary 1 input 201 includes a DSUB 9 pin connector. A Bio input 202 includes a DSUB 9 pin connector for biometric interface. A Power-Talk power distribution unit (PDU) input 203 includes a DSUB 9 pin connector. An auxiliary 2 input 204 includes a RJ45 8-8 jack. An Asset Tracker input 205 is for the U-Track module and includes an RJ45 8-8 female receptacle. A UPS input 206 is for a Power-Talk module having a 9 pin DSUB connector receptacle. A front air input 207 is for receiving front air circulation data input via a RJ45 connector.

A rear air input 208 is for air circulation at the rear of the ECA 100 including an RJ45 connector receptacle. A front temperature input 209 is for receiving temperature input from the front of the ECA via an RJ45 receptacle. A rear temperature input 210 for receiving temperature data for the rear of the ECA includes an RJ45 receptacle. A front lock input 211 is for receiving Access Control Module data via an RJ45 receptacle. A rear lock input 212 providing Access Control Module data for the rear of the ECA includes an RJ45 receptacle. An HID input 215 is for receiving RFID card reader information from the Asset Tracking module via RJ45 receptacle. A keypad input 214 is for receiving keypad information from the Cabinet Information Center connected via a standard keypad or keyboard connector.

Each of these connector ports 201-214 receives the data from the modules of the ECA 100 in an integrated fashion to be received and processed by firmware of the CCM 110 in order to communicate to all other components or modules within the ECA 100. The CCM 110 also includes a port 216 on the rear of the housing of the CCM 110. In an embodiment the port 216 that provides a connection to the internet and provides for a single IP address for the entire ECA 100, so that each of the module controls can be accessed remotely via the internet 220. For example, the CCM may follow an SNMP protocol.

The CCM 110 includes a humidity sensor 114e for determining the humidity within inside of the ECA 100. The sensor 114e is exposed to the cabinet ECA environment through a port in the top of the CCM 110. The sensor 114e measures the cabinet relative humidity and records the value in a DCIM server database as part of the Enviro-Track module.

Some of the inputs to the CCM 110 are repetitive and as illustrated in FIG. 7 not all of the inputs (e.g. 201-204) are populated or connected to components presently populating the ECA 100. For example, inputs 201-204 may be used at a later time when the rack is more fully populated. In the embodiment depicted in FIG. 7, inputs 205-211 are populated and are receiving data inputs from the modules populated within the ECA 100. Illustrative electrical connections are depicted in FIG. 7.

The Power Management module 112 of the ECA 100 includes an intelligent power distribution unit (PDU) 112. In a preferred embodiment, the PDU 112 is mounted towards the rear of the cabinet. Temperature sensors 114a in a preferred embodiment are mounted at the rear of the EVA 100 and temperature sensors 114d are mounted towards the front of the EVA cabinet 100. These temperature sensors, 114a,d provide information for the Enviro Track module that provide real time reporting of cabinet rack environmental data. The Enviro-Track module is a closed system which is integrated with the DCIM controller 110 and provides a broad range of sensing functions in a variety of configurations to meet ASHRAE and other standards for environmental conditions. The Enviro-Track module reports instantaneous and trending values for humidity via sensor 114e in the CCM 110 and temperature sensing including the six different sensing points 114a-d depicted in FIG. 7. In alternate embodiments, more or less than six sensors may be provided.

Air flow sensors 114b,g can provide airflow readings at the front and the rear of the ECA 100 as air may flow from a cool side of the ECA and out of the hot side. Sensors mounted on the door mesh panel may capture the least amount of air movement. The airflow sensor 114e data signal is captured by the CCM 110 and stored in the DCIM server database. The Enviro-Track module may be installed in a dense cabinet configuration that provides real time modeling of CFD values and performs scenario planning for data center cooling and capacity management. Airflow sensors 114b and e provide for capturing airflow data at the rear by sensor 114b and at the front of the cabinet by sensor 114e.

Sensors 114c and 114f provide data for the Lock-Talk module. Sensor 114c is the Lock-Talk sensor for the front of the cabinet and sensor 114f is the Lock-Talk sensor the rear of the ECA cabinet 100. These sensors allow for the DCIM Lock-Talk module Access Management feature to provide electronic access control, audit, reporting and alert management for data center cabinets. Lock-Talk is capable of providing a range of authentication methodologies including multi-factors secure access. In an embodiment, the sensors 114c,f can provide for a proximity card reader and a swing handle lock.

The Cabinet Information Center 130, as described above provides for a technician present at the ECA 100 to gain access to the CCM 110 functionality and control and monitor the ECA 100. The Cabinet Information Center in an embodiment, is a touch screen display that contains a Raspberry Pie processor that allows for direct communication and access to the components inside the cabinet, without having to open the cabinet door 107. Further details regarding the operation of the Cabinet Information Center are described with respect to FIGS. 14-19 below. Accordingly, the CCM 110 provides an integrated controller for each of the modules and components contained with the ECA 100.

Figure 8:
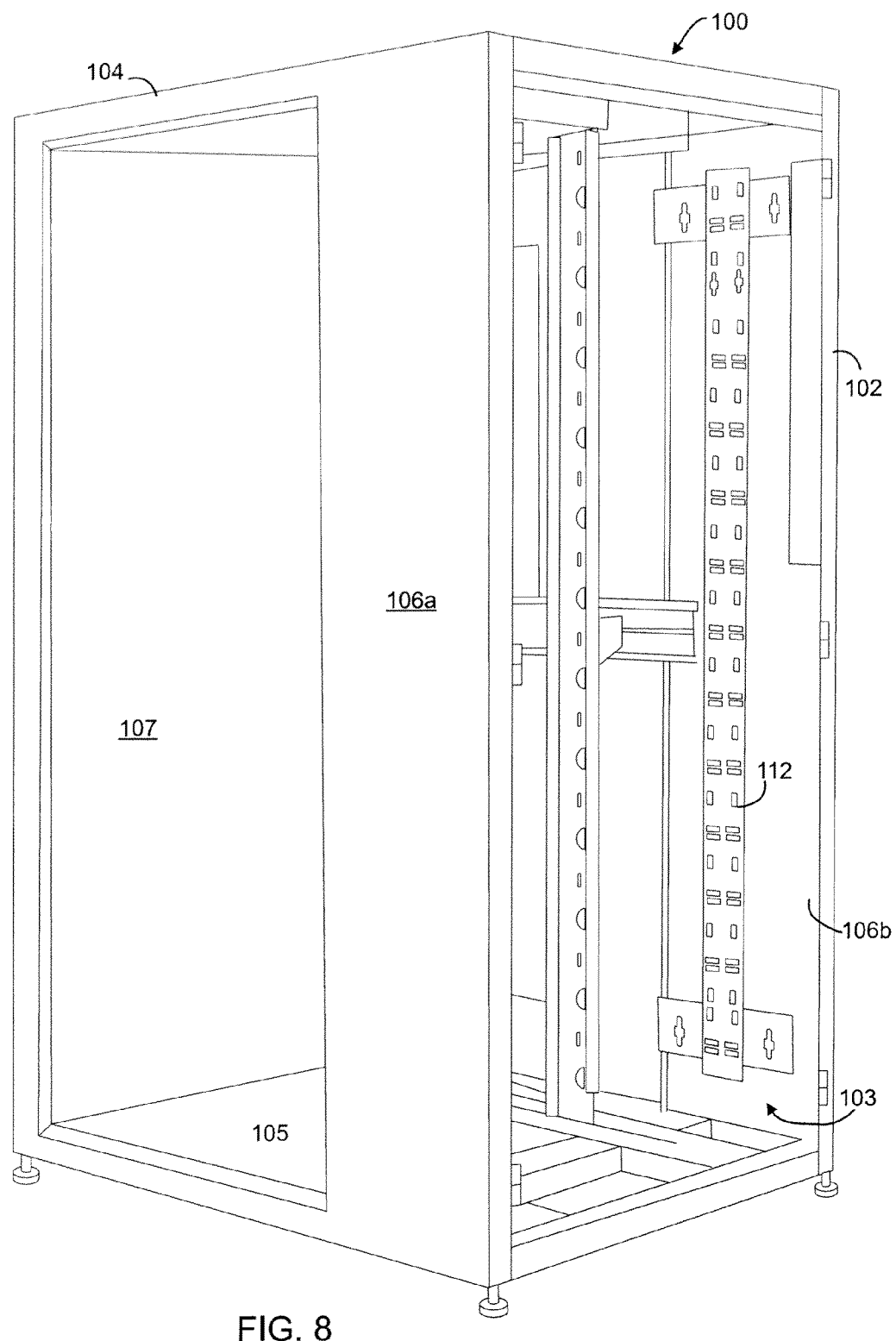
FIG. 8 is a rear perspective view of the equipment cabinet appliance of the present invention.

Turning to FIG. 8 a perspective view of an actual ECA 100 is provided depicting the open rear 103, a top 104, bottom 105, first side 106a, second side 106b and front access 107 (door not shown). The ECA 100 depicted in FIG. 8 is empty and has no equipment assets or CCM 110 mounted therein, so that the bracket to mount the power distribution unit of the power management module 112 is exposed. The power distribution unit (PDU) 112 is mounted to the second side 106b of the ECA 100 and provides for the Power-Talk module. A single cable connects the PDU to the CCDM 110. In an embodiment, a PDU such as a bayTech MMP series PDU may be used to provide the inputs for the Power-Talk solution. Regardless of the number of PDUs provided there is only a single cable needed to attach the Power-Talk flow bar 112 to the CCM 110.

Figure 9A:
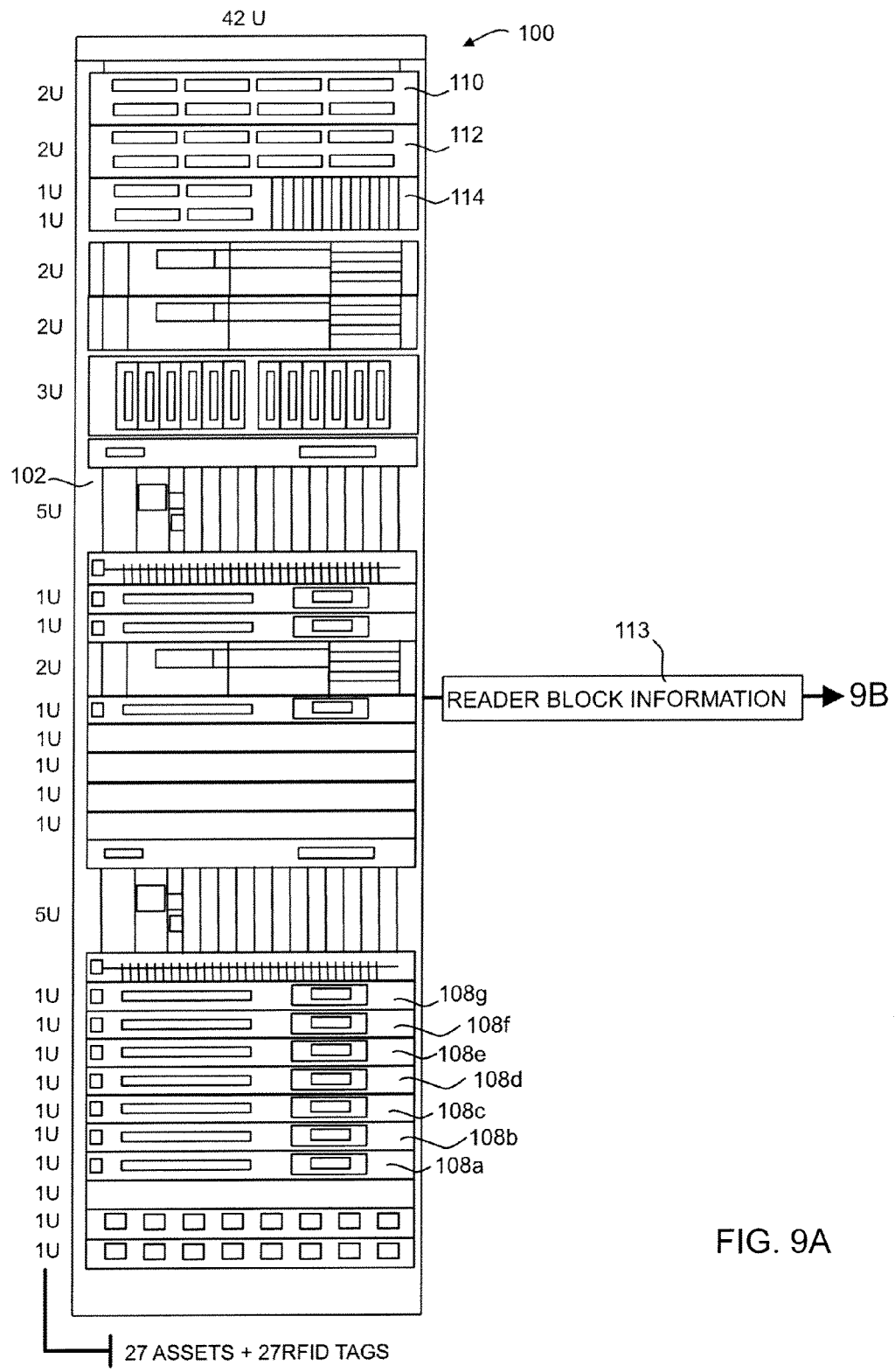
FIG. 9A is a front elevation view of an illustrative depiction of the equipment cabinet appliance of the present invention.

Turning to FIGS. 9A,B, the Asset-Track module of the U-Track module will be described. FIG. 9A provides an illustrative illustration of the ECA 100. The ECA 100 as depicted in FIG. 9A includes rack space of 42. On the left side of the diagram batch numeral ("1U") depicts the rack space populated by each of the assets mounted within the rack. FIG. 9A depicts a total of 27 assets each having an RFID tag.

Figure 9B:
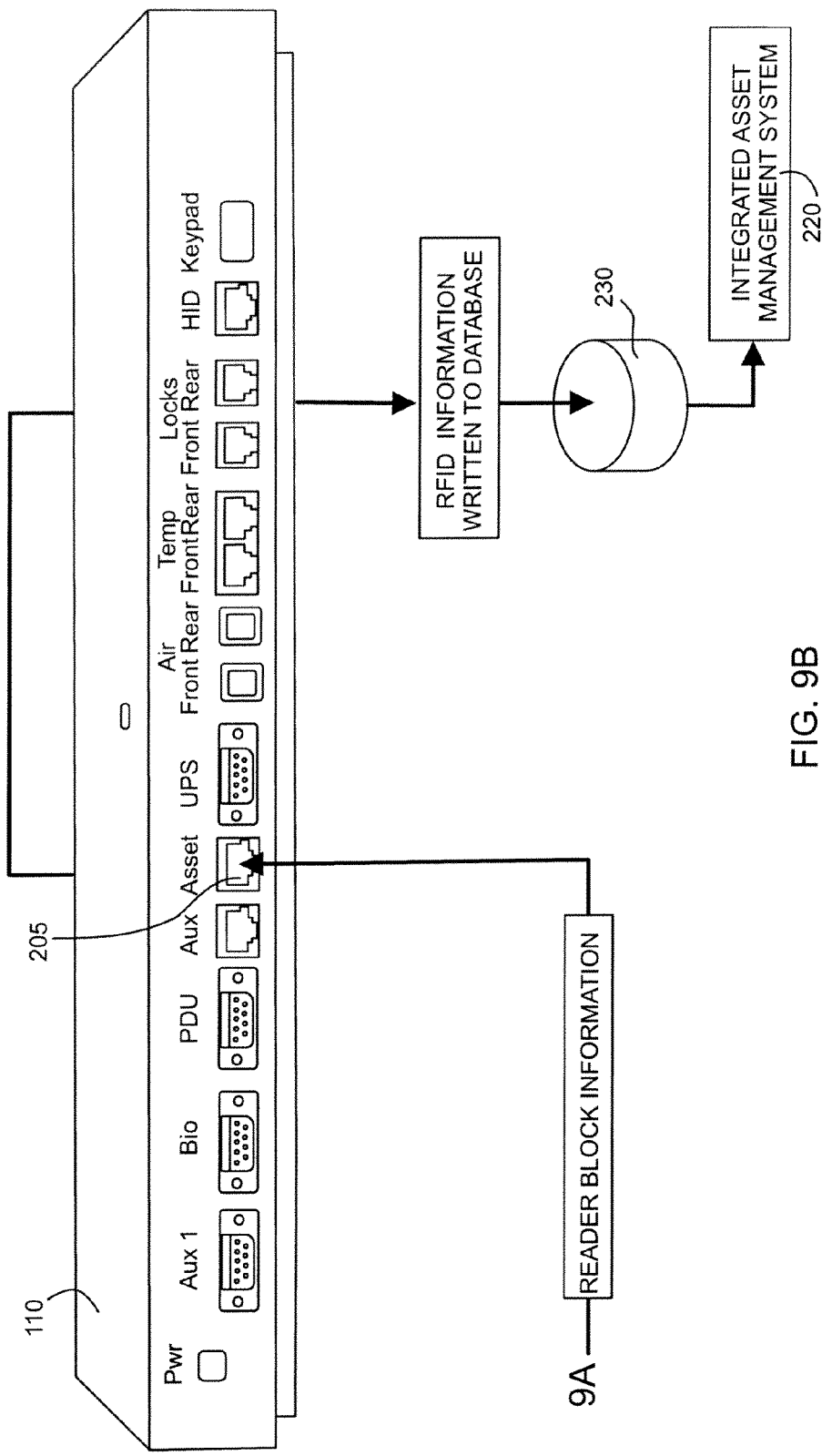
FIG. 9B is an illustrative view of the cabinet control module providing a diagrammatic connection from the components depicted in FIG. 9A.

For example, server blades 108a-g are mounted near the bottom of the rack and each server asset 108 populates one unit of the rack. As another example, the CCM 110 is mounted at the very top of the rack and populates two units of the rack. Likewise, power management module 112 is mounted below that and populates two units of the rack. Finally, environmental management 114 is mounted and also takes up two rack units. Each asset or equipment has an RFID tag, so there are a total of 27 RFID tags present in the illustrative rack of FIG. 9A. In an embodiment, each of the RFID tags is a read/write tag so that it may be modified as the equipment are moved from one location to another. The U-Track module includes a tag information file where data may be stored corresponding to the writing of the data to the RFID tag of each asset (e.g. 108a-g). When equipment is relocated from one rack to another, or other locations outside of the ECA rack 100 the RFID tag can be written to in order to reflect the new location. In FIG. 9B the reader block (reader strip 113) information is transmitted via the receptacle input 205 of the CCM 110 and the tag information file 230 is updated with the RFID information and the Integrated Management system is likewise updated with the data which may be accessed via the internet 220.

Figure 11:
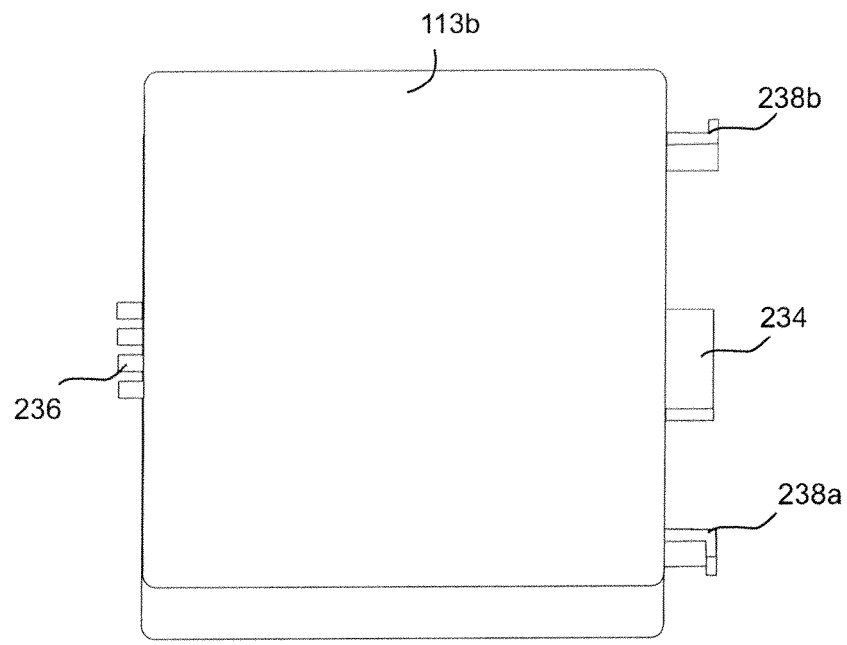
FIG. 11 is a top perspective view of a block of an asset tracking module.
Figure 12:
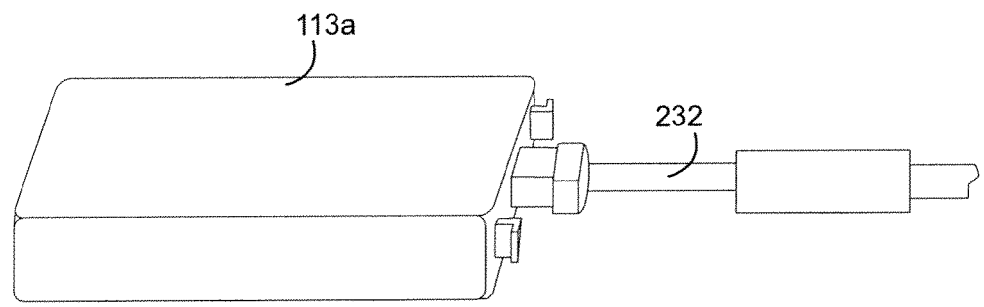
FIG. 12 is a side perspective view of a block of an asset tracking module having a pigtail cable connection.
Figure 13:
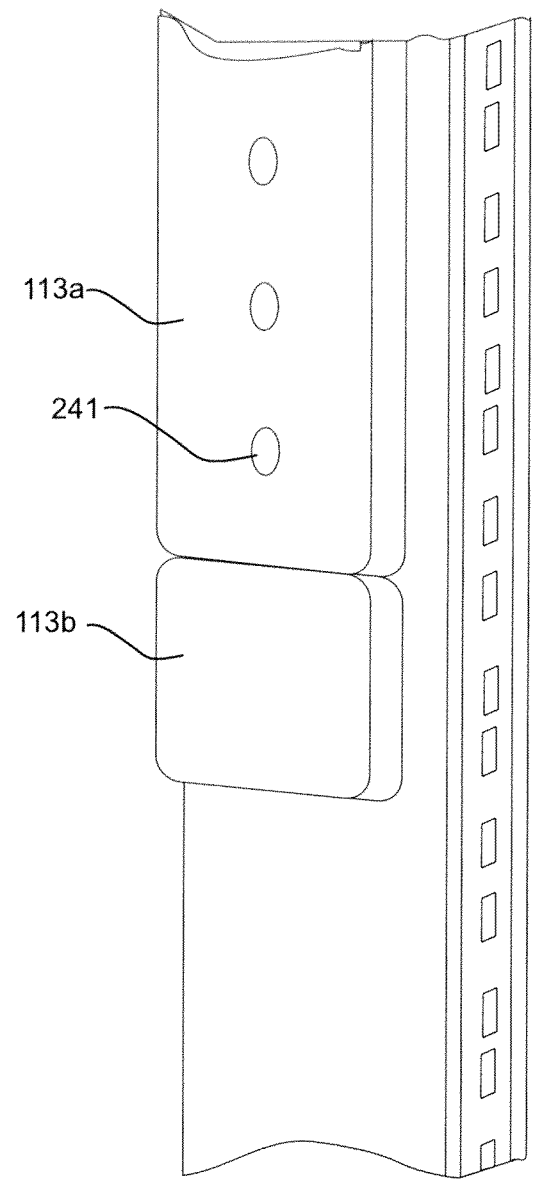
FIG. 13 is a front perspective sectioned view of an asset tracking module mounted to a sidewall of the equipment cabinet appliance.

In an embodiment, the RFID reader strips 113 (FIG. 12) are six RU long and include 6 RFID readers and 6 antennae. The U-Track system is assembled by mounting the reader strips 113 to the sidewall of the ECA 100 adjacent the front opening 107. For example, the RFID strip 113a depicted in FIG. 12 includes a hardwired cable 232 ("dongle") that will connect the strip 113a to the CCM 110 at the input 205. If the rack is populated with more than 6 RU then additional strips may be added. For example, 1 RU strip block 113b as depicted in FIG. 11, may be attached to the 6 RU strip 113a. As depicted in FIG. 11, the 1 RU reader block 13a includes a female end 234 (e.g. having female receptacles). On the opposite side is the male end 236, including male pins extending therefrom. It may be understood that individual 1 RU reader blocks 113 may each be assembled in series with each other. Or a 1 RU reader block 113 may be assembled to a 6 RU reader block as depicted in FIG. 13.

By assembling the reader block strips the entire rack space may be monitored by the U-Track system. The reader strip also includes fasteners 238a, 238b to attach each reader strip to an adjacent reader strip. In an embodiment the front of each reader strip 113a, 113b is white and translucent. In an embodiment each RFID reader is paired with light source, such as an LED 241, which is visible through the front translucent white material. For each RFID reader a red color illumination indicates the reader block is inactive. When the LED changes to the color blue, it indicates that the RFID reader is active and that an RFID tag of equipment is nearby and being transmitted and sending RF signals to the RFID reader of the RFID strip 113.

Figure 10:
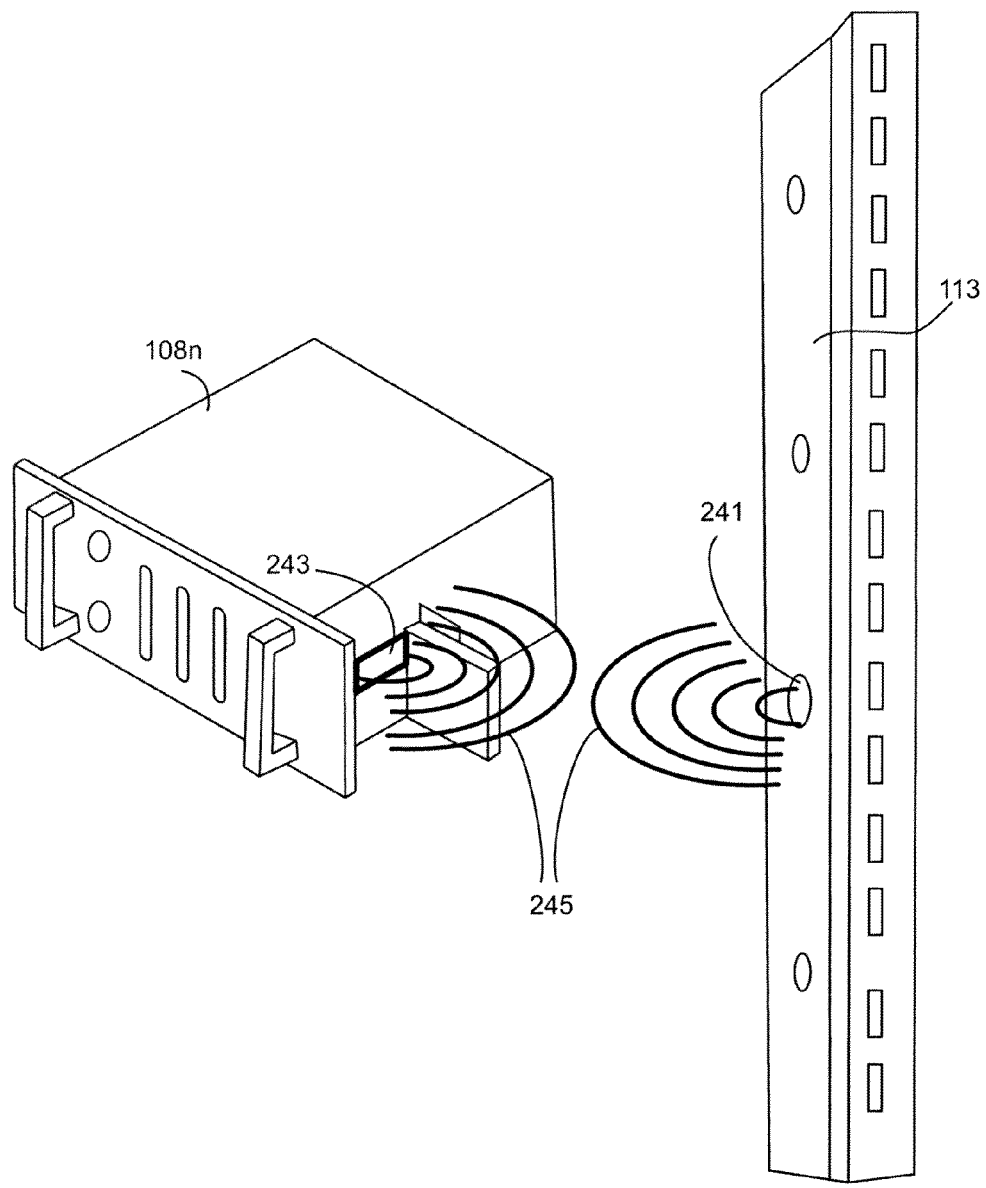
FIG. 10 is an exploded perspective view of an asset tracking module and piece of equipment being tracked by the asset tracking module.

Turning to FIG. 10, an asset 108n such as a server has a RFID tag 240 attached on a sidewall. The RFID reader strip 113 includes individual RFID readers to respond to the presence of an RFID tag 243. RFID transmissions 245 are depicted with respect to RF waves being transmitted and received between the reader strip 113 and the RFID tag 243. Each RFID tag 243 includes a individual ID code that will be transmitted to the reader within the strip 113 and that ID code will be transmitted by the strip 113 to the U-Track database having tag information files to correspond to the equipment 108n.

As the equipment 108n is placed into the rack adjacent a particular RFID reader, its location will be written to the database 230. For example, as depicted in FIG. 10, LED 241 will turn from red to blue as the radio frequency signal 245 is transmitted to RFID chip 243 to the antenna and RFID reader within the strip 113. In an embodiment, the U-Track system includes an updatable asset tracking module that is capable of writing to an equipment tag to enable modification of the tag information file when the equipment is relocated. The RFID tag 243 has read/write capabilities, so that the tag information file may be updated when the equipment 108n is moved away from the original rack and reader strip 113 to a new rack or other location.

For example, if the equipment 108n is moved to a shelf in a storage area, the RFID tag 243 may be written to in order to identify the shelf number and the storage area code. Likewise, if the equipment 108n is located on a shipping dock waiting to be shipped to another location, the dock may have an identification number that is written to the tag 243 while the equipment 108 is waiting to be transported to a new location. The new location data may be reflected in the U-Track database for the original ECA to which the equipment had been previously mounted. In an alternate embodiment, a general U-Track database may be established for an entire datacenter and the new location data for the equipment 108n, is updated for the general U-track database when the equipment 108n is outside an ECA. Therefore, it can be understood that via the wireless transmission of the RFID tag 243 and reader strip 113 the location of the equipment 108 may be automatically monitored so that the integrated management system may track such valuable assets.

In an embodiment, the reader strip 113a can read the RFID tag 243 and write to the RFID tag 243. In an alternate embodiment, the RFID reader of the reader strip 113 of the ECA 100 may also be read/writeable. However, in most cases, the reader strip 113 only needs to write to the RFID tag 243 of the equipment 108n. When the equipment 108 is removed from the ECA 100, the RF signal from the RFID tag 243 will be received by the RFID reader of the strip 113 mounted on the sidewall of the ECA 100 and the removal of the equipment 108n will be recorded by the database 230 and acknowledged by the integration management system 220 via the firmware of the CCM 110.

Figure 14:
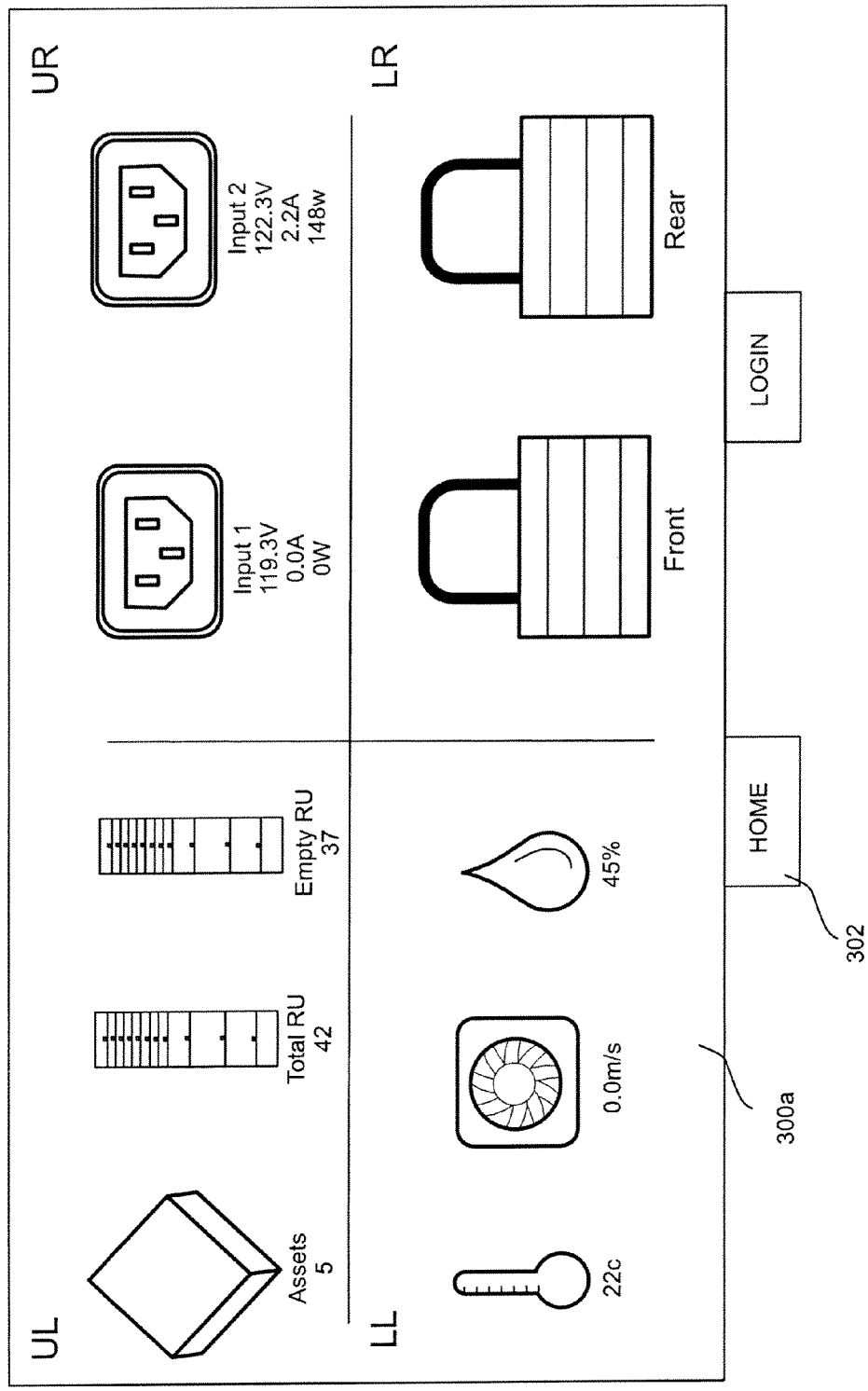

The operation of the cabinet information center will be discussed with respect to screenshots in FIGS. 14-19. FIG. 14 depicts a dashboard overview of the U-Track, Power-Talk, Enviro-Track and Lock-Talk data. The screenshot 300a upper left (UL) quadrant depicts the U-Track module data. To the far left, the U-Track is indicating that there are five assets located within the rack. There are a total of 42 RU spaces available within the rack and there are 37 RU empty. The dashboard depicted in FIG. 14, depicts in the upper right (UR) quadrant the Power-Talk module data including an Input 1 that is using 119.3 volts, 0 amps and 0 watts and Input 2 that is consuming 1.22.3 volts 2.2 amps and 148 watts.

The lower left (LL) quadrant of the dashboard screenshot 300a depicts the data from the Enviro-Track module, including the internal temperature within the rack of 22 Celsius, air circulation of 0.0 meters per second and a humidity of 45%. The lower right (LR) quadrant of the screenshot depicts the Lock-Talk module data indicating that both the front and rear of the cabinet are locked. The sideways Y-shaped icon on the front of the lock icon indicates the locked status of the front and rear of the rack. In an embodiment, the Y-feature may be a color, such as green. The screenshot 300 includes tabs at the bottom. By pressing tab 302 for home (HOME) the dashboard is displayed including the overview of the information of all four modules for U-Track, Power-Talk, Enviro-Track and Lock-Talk.

Figure 15:
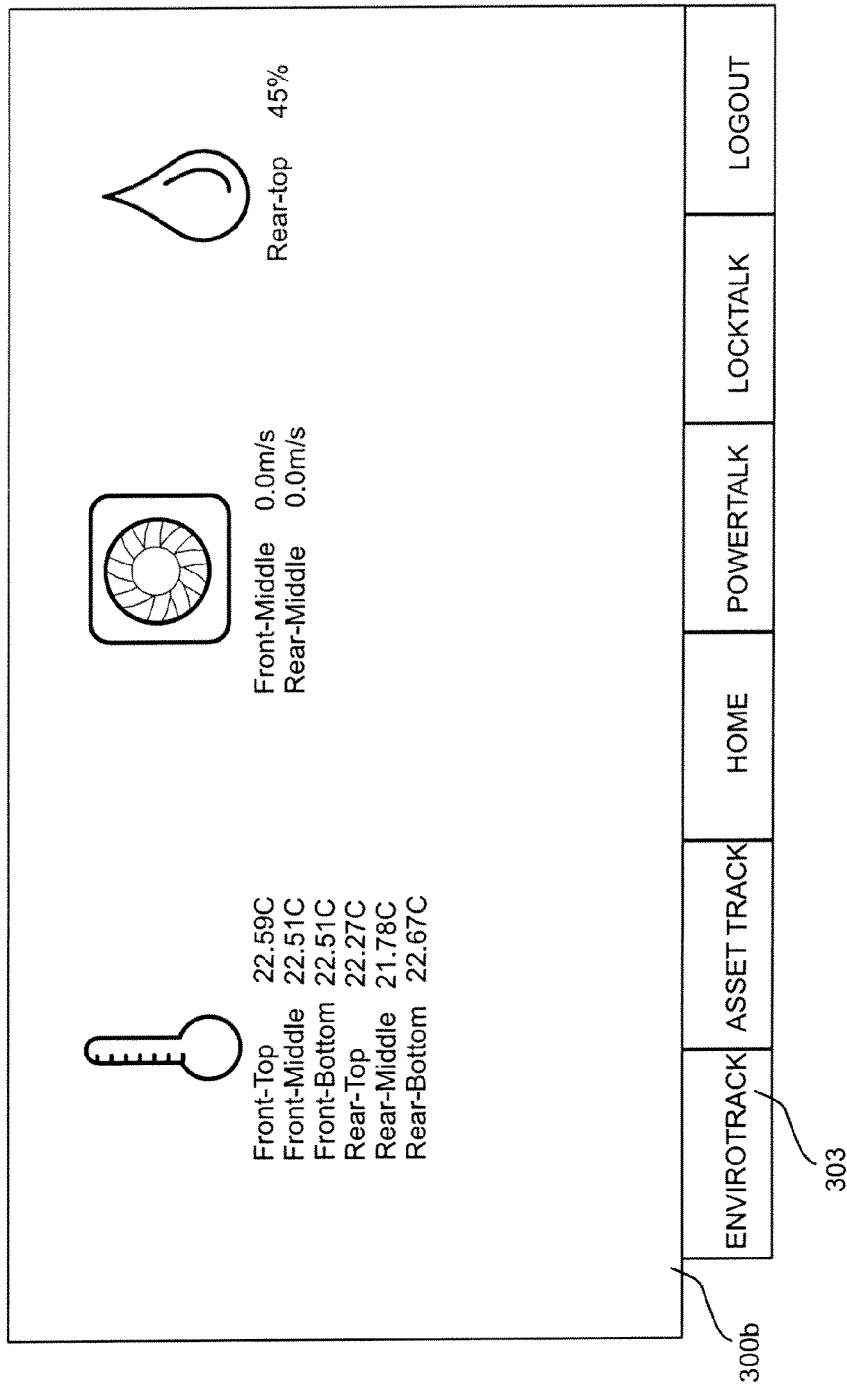

Turning to FIG. 15, the tab Enviro-Track 303 is activated and the screenshot changes to give more detailed information regarding the Enviro-Track module. For example, at the left side of the screenshot 300b the temperature for the front top, front middle, front bottom, rear top, rear middle, rear bottom are provided for each of the six locations of the temperature sensors 114a,d (FIG. 7). At the middle of the display, the airflow at the front middle and rear middle are displayed based on input from sensors 114b and e (FIG. 7). The relative humidity of the rack at the rear top is depicted on the right side of the screenshot 300b, based on the input from the humidity sensor 114e (FIG. 7).

Figure 16:
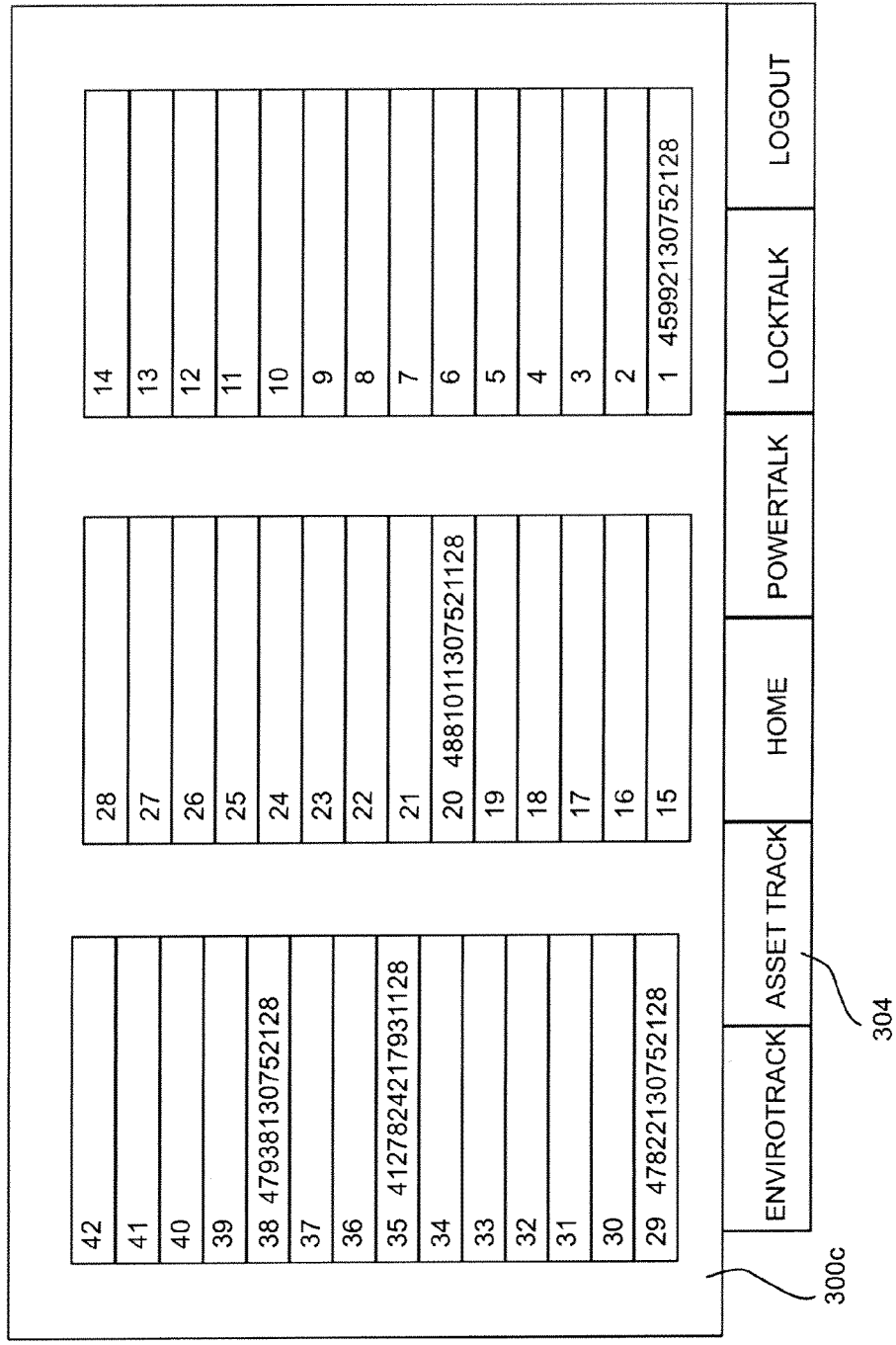

Turning to FIG. 16 the activation of the U-Track Asset Track feature is activated by depressing tab 304. The screen will change to screenshot 300c which depicts on the left side RU positions 29-42 and indicate that the RU positions 29, 35 and 38 are populated with assets based on their ID numbers. It will be understood, as discussed above that such asset tracking functionality is completed automatically when the equipment are placed with the rack at those locations based on the wireless transmission of the RFID tag on the equipment being monitored by the U-Track module and the RFID reader in the reader strip located in the side of the rack 100. Turning to the center of the screen shot 300c, the RU positions 15-28 are depicted and an indication that RU location 20 has equipment populated there and the ID number of the equipment is provided. Turning to the right side of the screenshot 300c, the rack location units 1-14 are depicted there and a single asset is populated at RU location 1. In an embodiment the screenshot 300c will be provided in color and each of the equipment designations may have a blue color so that they are easily located when viewing the screenshot 300c.

Turning to FIG. 17, the screenshot 300d depicts the Power-Talk module information indicating PDU input 1 having 20 positions and PDU input 2 having 20 positions and each position indicating the current by amps. The screenshot 300d includes the outlet port illustration to the left side of the screenshot 300d. The right side of the screenshot 300d indicates input lines 1 and 2 and the current by amps. This screen is accessed by activating tab 305 for the Power-Talk module.

Figure 18:
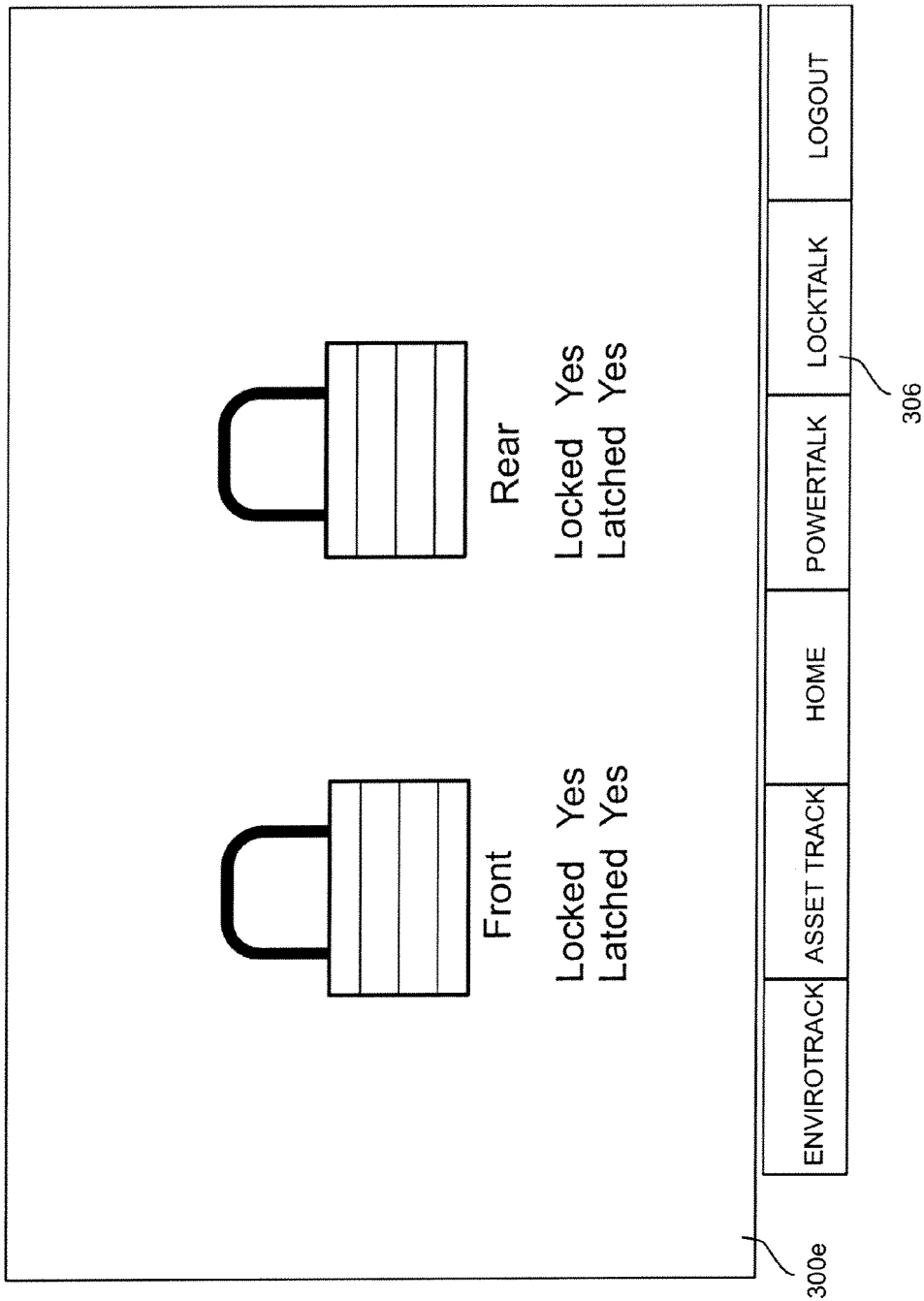

Turning to FIG. 18, the screenshot 300e is depicted and accessed by depressing the Lock-Talk tab 306. At the left side of the screenshot 300e is an icon for the lock feature indicating the front of the ECA cabinet stating that the front is locked and latched. The lock icon also includes a sideways Y to indicate the locked state. On the right side of the screenshot 300e is another lock icon indicating the state of the rear ECA cabinet. The lock icon with the Y-shaped icon indicates that the rear is both locked and latched.

Figure 19:
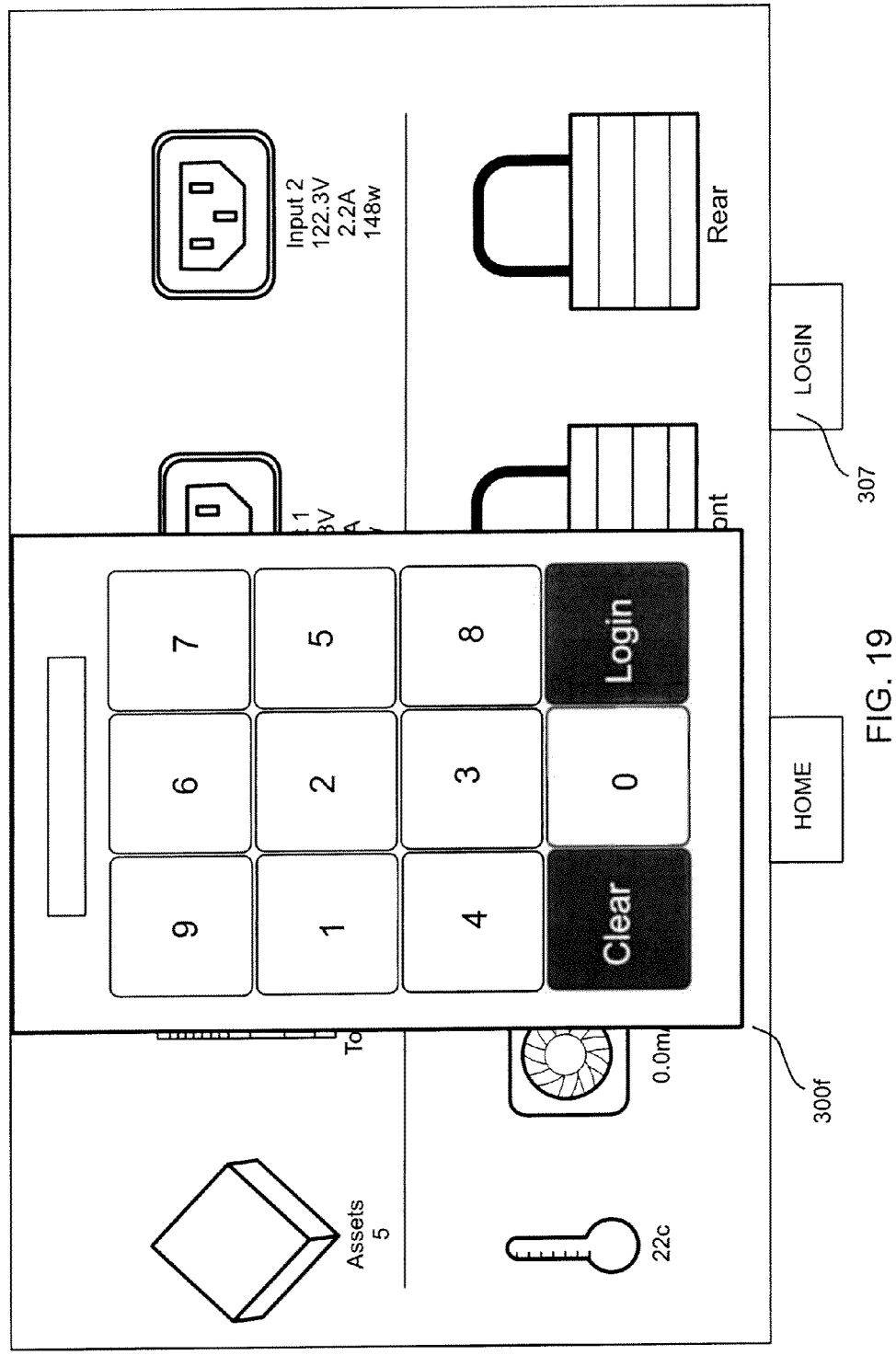

Turning to FIG. 19, the login screen 300f is depicted having the window 308 superimposed over the dashboard screenshot 300a. When the login button tab 307 is depressed the window 308 opens, so that the login code may be input on the screen. It is understood that the preferred embodiment of the system provides a touchscreen. By touching the alphanumeric icons represented on the screen display window 308 the activation of the system may occur. In an embodiment, a keyboard is also provided to make the inputs necessary for the system. The keyboard may include a mouse that allows a user to hover over each of the alphanumeric icons to activate those areas of the screenshot or window 308. Although the login was described herein after each of the screenshots 300a-e, in an embodiment the login screen may be the first screen used by a user to access the other data described above with respect to FIGS. 14-19. Therefore it is understood that the use of the DCIM system may be easily controlled and monitored via the screenshots 300a-f and the state of the ECA may be quickly identified by viewing the cabinet information center 130 and the screenshots 300a-f.

These and other advantages of the present invention will be apparent to those skilled in the art from the foregoing specification. Accordingly, it is to be recognized by those skilled in the art that changes or modifications may be made to the above-described embodiments without departing from the broad inventive concepts of the invention. For example, numerical values are illustrative rather than limiting, as are disclosures of specific standards, technologies, or brands.

It is to be understood that this invention is not limited to the particular embodiments described herein, but is intended to include all changes and modifications that are within the scope and spirit of the invention, which should therefore be construed as limited only by the appended claims.

What is claimed is:

1. A data center infrastructure management electronic cabinet integrated rack appliance, the integrated appliance comprising:

a rack frame enclosure having a first side wall, a second side wall, the first and second sidewalls extending between a top and bottom, a first opening extending between the top and bottom, a door for enclosing the first opening and a second opening extending between the top and bottom and the frame having an inside surface defined by a portion of one of the first and second side walls, the inside surface extending between the top and bottom, the rack defining an interior space for accommodating a plurality of electronic equipment, the electronic equipment being removable through the first opening;

a plurality of functional modules selected from a group consisting of:

an updatable asset tracking module for detecting the presence or absence of the electronic equipment from the interior space of the cabinet frame enclosure including a tag information file that identifies the electronic equipment, the updatable asset tracking module capable of writing to an electronic equipment tag to enable modification of the tag information file when the electronic equipment is relocated, the asset tracking module disposed along the inside surface;

an access control module for providing electronic locking and access control to the interior space of the cabinet frame enclosure;

an environmental management module for monitoring and controlling environmental conditions within the interior space of the cabinet frame enclosure;

a power management module for monitoring and controlling power distribution to electronic equipment located in the interior space of the cabinet frame enclosure, the power management module disposed in one of the first side wall or second side wall and adjacent the second opening;

a cabinet control module (CCM) for providing consolidated connectivity to the plurality of functional modules, wherein the CCM presents a single network connection for managing the electronic equipment located in the cabinet frame enclosure.

2. The integrated appliance of claim 1, wherein the updateable asset tracking module is configured to detect the electronic equipment wirelessly and an RFID tag attached to the electronic equipment.

3. The integrated appliance of claim 2, wherein the updateable asset tracking module is configured to write to one or more RFID tags attached to the electronic equipment.

4. The integrated appliance of claim 3, wherein the updateable asset tracking module comprises one or more RFID readers provided by a detachable strip located within the interior space of the cabinet frame enclosure.

5. The integrated appliance of claim 4, wherein the updateable asset tracking module further comprises a plurality of blocks connected in series and each block containing at least one RFID reader.

6. The integrated appliance of claim 5 wherein each block includes a male end and an opposite female end so that corresponding blocks may be interconnected to form a strip.

7. The integrated appliance of claim 1, wherein the access control module comprises one of: a touch-sensor-based key keypad, a proximity card reader, an on-screen touch-screen control, a remote network control, and biometric access.

8. The integrated appliance of claim 1, wherein the access control module is configured to use visual data including at least one of still images and video.

9. The integrated appliance of claim 1, wherein the environmental management module includes one of a fan and a dehumidifier for controlling one of airflow and humidity within the interior space of the cabinet frame enclosure.

10. The integrated appliance of claim 1, wherein the power management module comprises one or more of: a power distribution unit (PDU), a power strip, and an intelligent power battery backup device.

11. The integrated appliance of claim 1, wherein the power management module is configured to selectively control at least one of power delivery and power storage to the electronic equipment.

12. The integrated appliance of claim 1, wherein the cabinet control module is wirelessly connect to the plurality of functional modules.

13. The integrated appliance of claim 1, wherein the cabinet control module is wired to the plurality of functional modules.

14. The integrated appliance of claim 1, wherein the cabinet control module comprises a touch-screen display for providing external user interaction between a user and the integrated appliance.

15. The integrated appliance of claim 1, wherein the cabinet control module is configured to manage a correlated automation scenario where information received from at least a first functional module is used to manage at least a second functional module.

16. The integrated appliance of claim 1, wherein the single network connection has a single IP address.

17. The electronic equipment rack of claim 16 wherein the first component includes an asset tracking module that is configured to detect one or more RFID tags attached to the electronic equipment.

18. The electronic equipment rack of claim 17 wherein the first and second component each include an RFID reader having a capability to write to an RFID tag mounted to the electronic equipment.

19. The electronic equipment rack of claim 17 further comprising a third component located below the first component in the first sidewall for wirelessly detecting the presence of at least one of the electronic equipment.

20. A self-contained and self-monitoring electronic equipment rack comprising:
a cabinet frame enclosure having a first side wall, a second side wall, a first opening and a second opening each in combination defining an interior space for accommodating a plurality of electronic equipment, a door for enclosing one of the first or second openings, the electronic equipment being removable through the first opening along a removal path;
a first component disposed in the first sidewall adjacent the removal path, the first component for wirelessly detecting the presence of at least one of the electronic equipment, the first component including a tag information file that identifies the electronic equipment and having a read and write capability to enable modification of the tag information file when the electronic equipment is relocated;
a second component for locking the door of the cabinet, the second component controlled remotely and electronically,
a third component having a temperature sensor, a fan and a remote control for controlling temperature within the cabinet;
a fourth component disposed in the first or second side wall for providing power to the entire cabinet and each of its first, second and third components via a single power cable, each of the first, second and third components connected to the fourth component;
a cabinet control module (CCM) connected to each of the first, second, third and fourth components and the CCM for consolidating the monitoring and control of the first, second, third and fourth components; and
a display screen linked to the CCM for viewing component operation data and controlling the CCM, the display screen accessible from outside the cabinet without opening the door.

21. An updateable asset tracking system comprising:
a cabinet frame enclosure having a first side wall, a second side wall, a first opening and a second opening each in combination defining an interior space for accommodating a plurality of electronic equipment, a door for enclosing one of the first or second openings, the electronic equipment being removable through the first opening;
a first component disposed in the first sidewall for wirelessly detecting the presence of at least one of the electronic equipment, the first component remaining stationary with respect to the electronic equipment when removed from the cabinet, the first component capable of tracking the removal of the electronic equipment, the first component including a tag information file that identifies the electronic equipment and having a read and write capability to enable modification of the tag information file when the electronic equipment is relocated;
a second component disposed in the second sidewall for wirelessly detecting the presence of at least one of the electronic equipment, the second component including a tag information file that identifies the electronic equipment and having a capability to enable modification of the tag information file when the electronic equipment is relocated.

* * * * *